United States Patent
Tsukamoto et al.

[11] Patent Number: 5,852,296
[45] Date of Patent: Dec. 22, 1998

[54] X-RAY IMAGING APPARATUS

[75] Inventors: Akira Tsukamoto; Takayuki Tomisaki, both of Tochigi, Japan

[73] Assignee: Kabushiki Kaisha Toshiba, Kawasaki, Japan

[21] Appl. No.: 879,186

[22] Filed: Jun. 20, 1997

[30] Foreign Application Priority Data

Jun. 21, 1996  [JP]  Japan .................................. 8-161977
Dec. 6, 1996   [JP]  Japan .................................. 8-326993

[51] Int. Cl.⁶ .............................. G01T 1/24; A61B 6/00
[52] U.S. Cl. ................................. 250/370.09; 378/98.8
[58] Field of Search ..................... 250/370.09, 370.14, 250/580; 378/98.8, 108

[56] References Cited

U.S. PATENT DOCUMENTS

| | | |
|---|---|---|
| 5,198,673 | 3/1993 | Rougeot et al. . |
| 5,245,191 | 9/1993 | Barber et al. ....................... 250/363.04 |
| 5,313,066 | 5/1994 | Lee et al. ................................. 250/580 |
| 5,319,206 | 6/1994 | Lee et al. . |
| 5,483,071 | 1/1996 | Oikawa et al. .................... 250/370.09 |
| 5,604,347 | 2/1997 | Petrick et al. ..................... 250/370.09 |
| 5,629,524 | 5/1997 | Stettner et al. .................... 250/370.09 |
| 5,652,430 | 7/1997 | Lee ..................................... 250/370.09 |
| 5,668,375 | 9/1997 | Petrick et al. ..................... 250/370.09 |

FOREIGN PATENT DOCUMENTS 60-210841  10/1985  Japan ..................................... 378/108

*Primary Examiner*—Edward J. Glick
*Assistant Examiner*—Darren M. Jiron
*Attorney, Agent, or Firm*—Oblon, Spivak, McClelland, Maier & Neustadt, P.C.

[57] ABSTRACT

A plurality of photoelectric conversion sections correspond respectively to a plurality of pixels arranged on a detection surface for converting incident X rays into charge. A plurality of charge storage sections store the charge converted by the plurality of photoelectric conversion sections, respectively. A plurality of transfer TFTs read out the charge stored in the plurality of charge storage sections, respectively. A plurality of protective TFTs have an end thereof connected to the each input terminal of the plurality of transfer TFTs and sweep out from the other end thereof the charge stored in the charge storage sections when the voltage applied thereto exceeds a predetermined voltage level lower than the breakdown voltage of the transfer TFTs.

26 Claims, 16 Drawing Sheets

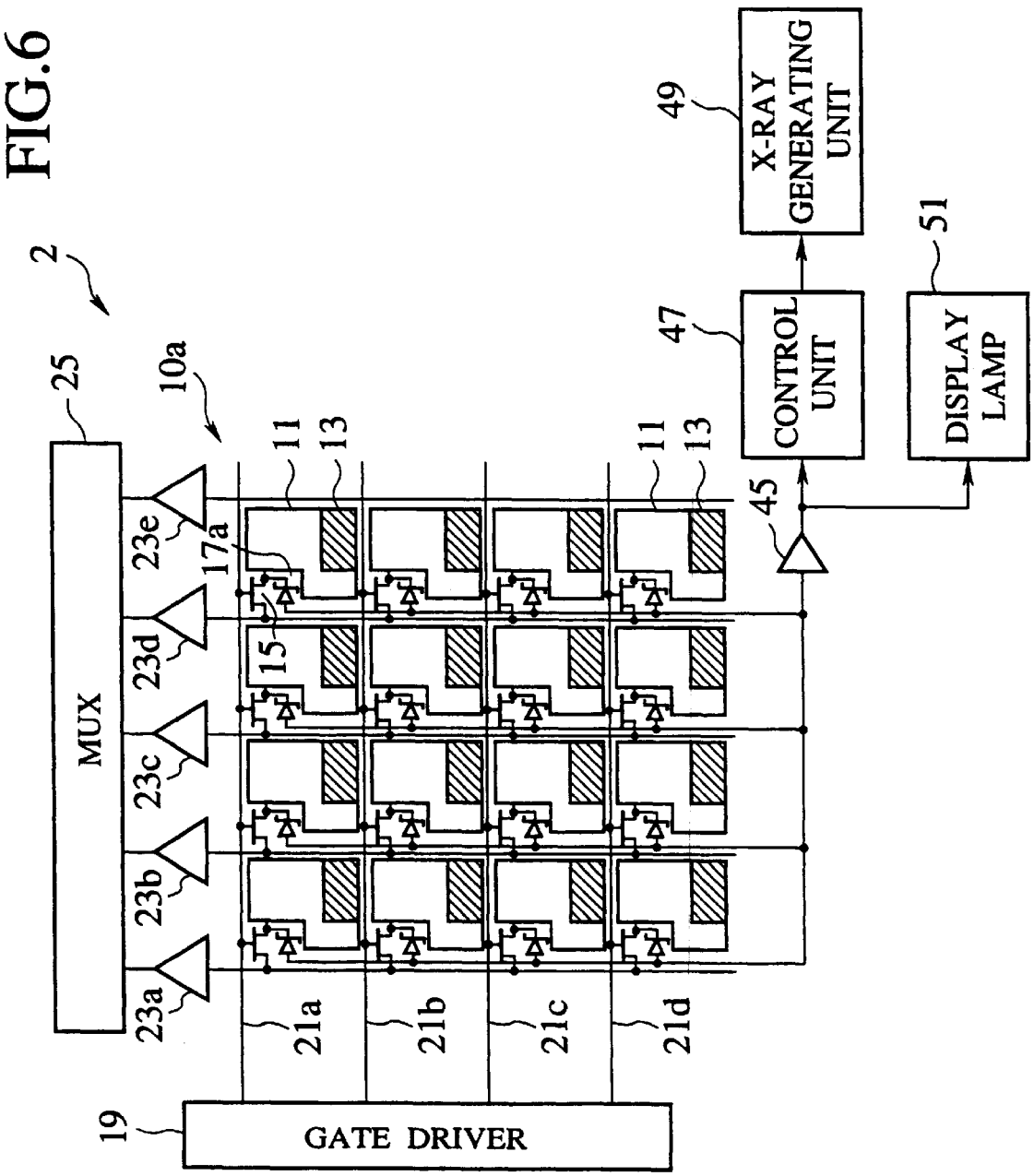

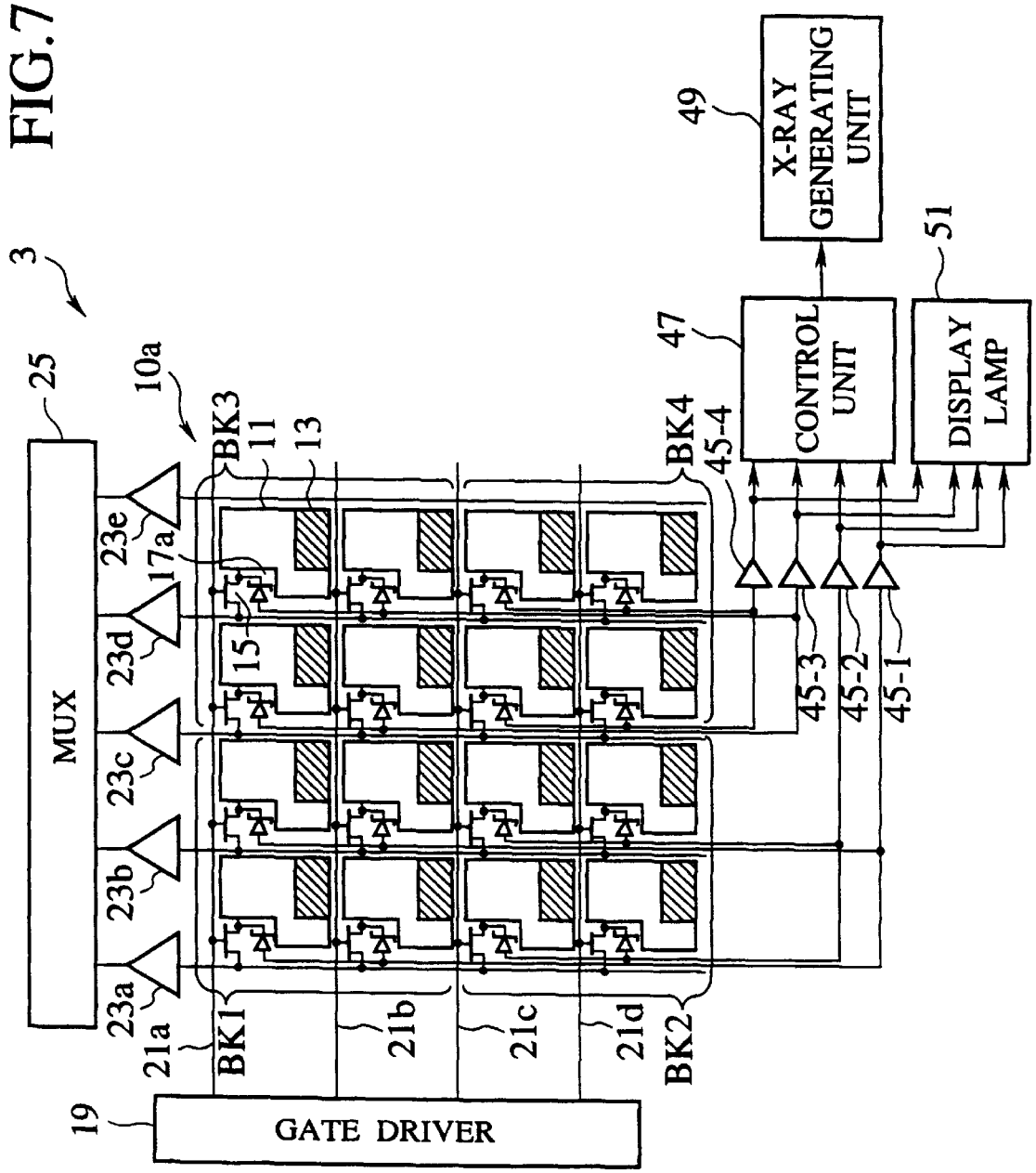

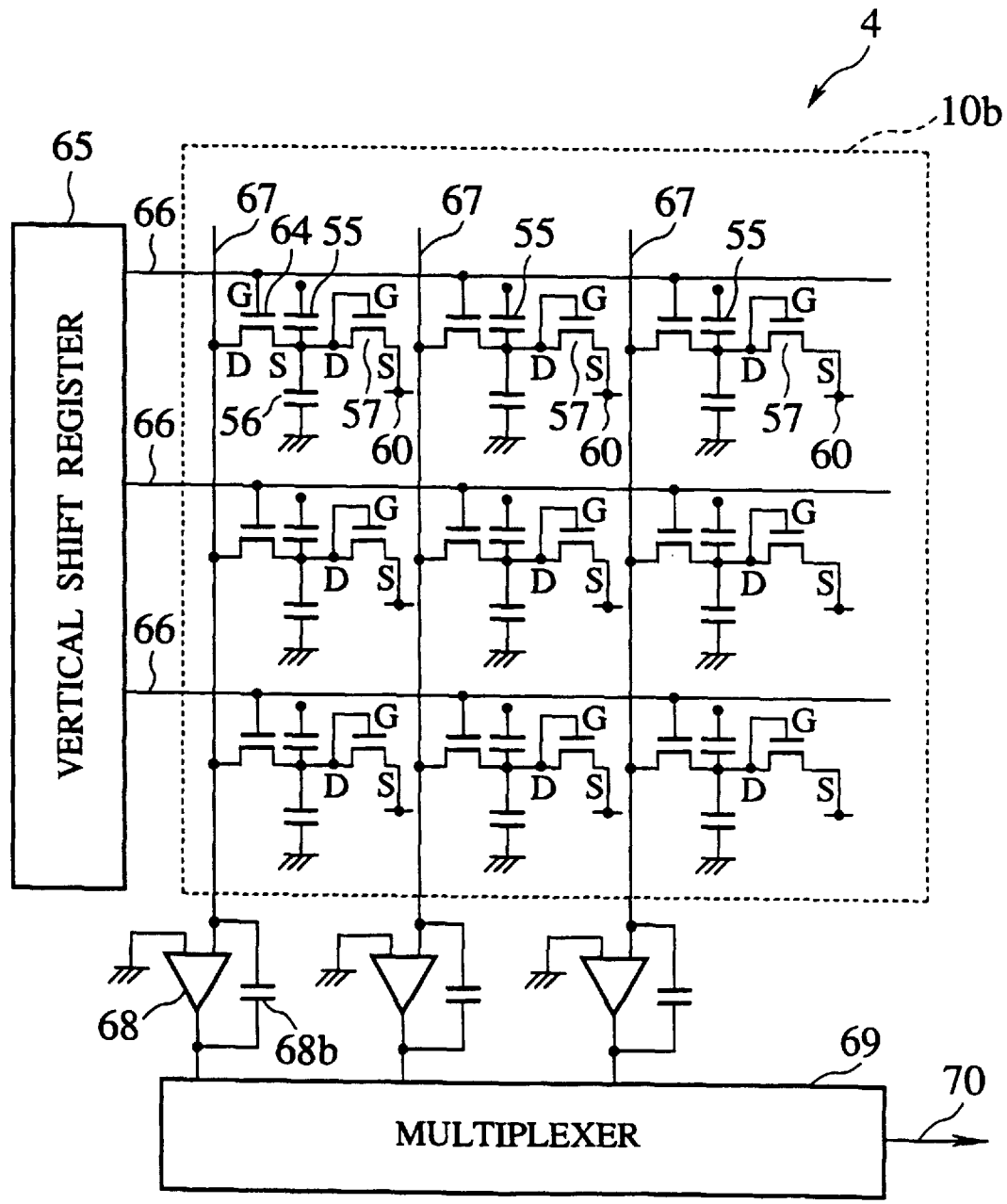

X-RAY IMAGING APPARATUS

BACKGROUND OF THE INVENTION

1. Field of the Invention

The present invention relates to an X-ray imaging apparatus for producing an image from an X ray transmitted through the human body.

2. Description of the Related Art

The conventional imaging system used mainly for X-ray imaging analysis includes the following, for example:

(1) An analysis screen film system in which X-ray imaging is conducted with a combination of an intensifying screen and an X-ray film held in a case called the cassette.

At the time of X-ray imaging with such a film system, a GRID or the like vibrating at high speed is often used with the cassette in order to remove scattering effects. The cassette is several mm thick and comparatively small and light in weight and is sometimes brought with a mobile X-ray generator to the bedside of a patient who cannot be removed for the purpose of X-ray imaging.

On the other hand, a cassetteless film system employed with an X-ray couch includes a magazine for holding an unused film portion and a used film portion and a film transport section. At the time of X-ray imaging, the unused film portion is transported to a predetermined position where the X-ray grid and the intensifying screen are arranged. At this position, the unused film portion is exposed to X-rays for imaging.

The film portion that has been exposed to an X-ray image can be developed by an automatic developing unit and then observed as an X-ray image.

The currently available films, however, have to be handled with care not to exposed or damaged before complete development.

Also, an exclusive processing unit such as an automatic developing unit is required. The exclusive processing unit which is used with water and chemicals can be installed only in limited places, and the image produced by it cannot be displayed immediately.

(2) A computed radiography system, on the other hand, is an X-ray imaging system which uses a plate (imaging plate) coated with a photostimulable phosphor instead of such conventional film as an X-ray detector.

The imaging plate has a very wide dynamic range as compared with the film and can take an image with a wide range of dose. Upon irradiation of an X-ray on the imaging plate, the electron energy level is heightened by the X-ray energy to such an extent that an X-ray intensity distribution is stored as a latent image.

After that, with the excitation to electrons of high level by irradiation with a laser light, the resultant energy is output as light. The intensity of this light is proportional to the X-ray energy absorbed into the imaging plate, and therefore an X-ray image can be produced electrically by converting the intensity of the light into an electric signal.

The conventional imaging plate, however, is low in resolution and noisy. Also, it is easily damaged and the performance thereof often deteriorates during use. Further, the reader used with it is expensive.

(3) Still another conventional system is a combination of an image intensifier (I.I.) for converting X-rays into light and a television set to produce an X-ray image (I.I.-TV system). In this system, the area of the X-ray input surface of the image intensifier represents the size that can be imaged and is equivalent to a field of view of about 16 inches at a maximum.

The X-ray image converted into light is focused at the output section of the image intensifier. This output image is picked up by the television camera through an optical system and reproduced as an electrical image. In this system, an X-ray image can be observed in real time.

This system, however, has the disadvantages of a low resolution and a bulky image pick-up system as compared with the film system.

In recent years, an X-ray imaging apparatus using a switching gate comprised of a thin-film transistor (TFT) has been proposed as the next-generation X-ray imaging apparatus having the same real-time capability as the I.I.-TV system as well as the same portability and the same high resolution as the film screen system or the imaging plate.

A first configuration proposed for the switching gate X-ray imaging apparatus comprises a phosphor member for converting X-rays into light, a photodiode array for converting the light into charge, a capacitor for storing the charge and a switch for reading the charge,(hereinafter called a reading SW) all arranged on a tabular detection surface.

A second configuration proposed for the switching gate X-ray imaging apparatus comprises a pixel section including a semiconductor layer for converting X-rays directly into charge, a charge storage section including a capacitor for storing the charge and a reading SW, all arranged on a tabular detection surface.

Both of the above-mentioned proposed configurations are those of electrical imaging apparatuses for producing an image similar to that of the film system, and like the conventional I.I.-TV system, have a superior capability of immediately displaying an image and can easily store an image electrically. Further, with a thin structure, these apparatuses can employ a cassette using a film screen system or an imaging plate.

With the X-ray imaging apparatus of the second proposed configuration described above, however, the charge may increase in proportion to the amount of X rays incident to each pixel to such an extent that a high voltage may be applied to the charge storage section. This voltage is applied to the input terminal of the reading SW during X-ray irradiation. When the voltage thus applied during the X-ray irradiation exceeds a predetermined level, the reading SW may break down.

This situation can occur especially when an unnecessarily large amount of X rays are irradiated on to the detector. Clinically, charge increases and a high voltage is applied to the charge storage section, for example, in the case where the X rays produced from an X-ray tube enter the detector directly without being transmitted through the human body constituting an object or in the case where X rays are irradiated erroneously over a protracted length of time. As a result, the voltage applied to the input terminal of the reading SW exceeds a predetermined level and damages the reading SW.

For a superior X-ray image to be obtained, on the other hand, the image information produced during X-ray irradiation can desirably be monitored in real time. As a means for realizing this object, an X-ray exposure monitor using a front-exposed fiber scintillator in a film system or an I.I. output light monitor using a photoelectric multiplier tube (PMT) or the like in an I.I.-TV system finds applications.

The X-ray imaging apparatus configured as described above, like the film system, may be combined with a fiber scintillator of front-exposure type. Such a configuration, however, requires an exclusive detection mechanism, leading to an increased equipment size and a higher equipment cost.

SUMMARY OF THE INVENTION

An object of the present invention is to provide an X-ray imaging apparatus for a flat panel X-ray detector having such a structure as to be capable of applying a high voltage to a reading SW during X-ray irradiation, in which the X-ray irradiation can be monitored at low cost using small sized equipment while at the same time preventing the breakage of the reading SW.

Another object of the invention is to provide an X-ray imaging apparatus in which the leakage current of the reading SW can be minimized while at the same time preventing the breakage of the reading SW.

In order to achieve the above-mentioned objects, according to the present invention, there is provided an X-ray imaging apparatus comprising a plurality of charge conversion means respectively corresponding to a plurality of pixels arranged on a detection surface for converting incident X rays into charge, a plurality of charge storage means for storing the charge converted by the charge conversion means, a plurality of charge reading means for reading the charge stored in each of the charge storage means, and a plurality of sweeping means each with an end thereof connected to an input terminal of each of the plurality of the charge reading means for sweeping from an other end thereof the charge stored in the charge storage means when a voltage applied thereto exceeds a predetermined level.

According to the present invention, the charge is swept out utilizing the voltage breakdown characteristic of the sweeping means before reaching a potential at which the charge reading means would otherwise break down, and therefore the charge reading means is protected from breakage even in the case where a high voltage due to the charge can be applied to the charge reading means during the X-ray irradiation.

According to a first preferred aspect of the invention, the sweeping means includes a zener diode.

According to a second preferred aspect of the invention, the sweeping means includes a plurality of zener diodes connected in series.

According to a third preferred aspect of the invention, the sweeping means includes a specific field effect transistor with a gate thereof connected to a source or a drain thereof.

According to a fourth preferred aspect of the invention, the sweeping means includes a plurality of series-connected field effect transistors each with a gate thereof connected to a source or a drain thereof.

According to a fifth preferred aspect of the invention, the sweeping means includes a plurality of series-connected field effect transistors with gates thereof commonly connected to the end of the sweeping means.

According to a sixth preferred aspect of the invention, the gate is connected to the source or the drain through means for generating a predetermined potential difference.

In this aspect of the invention, the leakage current in a normal operation region can be reduced.

According to a seventh preferred aspect of the invention, the means for generating a potential difference includes a first field effect transistor with a gate thereof connected to the source or the drain of the specific field effect transistor, with a source thereof connected to the gate of the specific field effect transistor, and with a drain thereof connected to a predetermined voltage terminal, and a second field effect transistor with a drain thereof connected to the source of the first field effect transistor and with a gate and a source thereof connected to a predetermined voltage terminal.

According to an eighth preferred aspect of the invention, the means for generating a potential difference includes a capacitor inserted between the gate and the source or the drain of the specific field effect transistor, and a field effect transistor with a drain thereof connected to the gate of the specific field effect transistor, and with a gate and a source thereof connected to a predetermined voltage terminal.

According to a ninth preferred aspect of the invention, the other end of the sweeping means is supplied with a predetermined potential.

In this aspect, the sweeping means can be prevented from breaking down and sweeping out the charge in the normal operation region.

According to a tenth preferred aspect of the invention, the predetermined voltage is a voltage associated with the time when the pixel is saturated with the charge.

In this aspect, the charge of the pixels, if saturated, can be swept out.

According to an 11th preferred aspect of the invention, there is provided an X-ray imaging apparatus further comprising a charge retrieval means for retrieving the charge swept out of the sweeping means.

In this aspect, the saturation of pixel charge can be monitored.

According to a 12th preferred aspect of the invention, the charge retrieval means is an amplifier for equally retrieving the charge swept out from each of the sweeping means.

According to a 13th preferred aspect of the invention, the sweeping means is divided into a plurality of blocks and the charge retrieval means includes a plurality of amplifiers each for retrieving a plurality of charge from the corresponding one of the blocks.

In this aspect, the saturation or non-saturation of charge can be monitored for each block.

According to a 14th preferred aspect of the invention, there is provided an X-ray imaging apparatus further comprising control means for controlling an X-ray generation unit based on the output of the charge retrieval means.

In this aspect, the amount of the incident X rays can be suppressed upon charge saturation.

According to a 15th preferred aspect of the invention, there is provided an X-ray imaging apparatus further comprising a correction data memory means for storing the value of the charge read out by each of the charge reading means and storing the value thus read as correction data when X rays are not applied to the pixels, and a correction means for subtracting the value of the corresponding charge in the correction data from each value of the charge read out of the charge reading means when an X ray is applied to the pixels thereby to determine an accurate charge value not affected by the leakage current.

In this preferred aspect of the invention, an X-ray image can be produced based on an accurate charge value not affected by the leakage current.

According to a 16th preferred aspect of the invention, there is provided an X-ray imaging apparatus further comprising a display means for displaying as an image the accurate charge value determined by the correction means.

According to an 17th preferred aspect of the invention, there is provided an X-ray imaging apparatus further comprising an image data memory means for storing the accurate charge value determined by the correction means.

The nature, principle and utility of the invention will become more apparent from the following detailed description when read in conjunction with the accompanying drawings.

BRIEF DESCRIPTION OF THE DRAWINGS

In the accompanying drawings:

FIG. 6 is a diagram showing a general configuration of an X-ray imaging apparatus according to a third embodiment of the present invention;

FIG. 7 is a diagram showing a general configuration of an X-ray imaging apparatus according to a fourth embodiment of the present invention;

FIG. 9 is a diagram showing a general configuration of an X-ray imaging apparatus according to a fifth embodiment of the present invention;

DESCRIPTION OF THE PREFERRED EMBODIMENTS

An X-ray imaging apparatus according to embodiments of the invention will be described in detail below with reference to the accompanying drawings.

Figure 1:
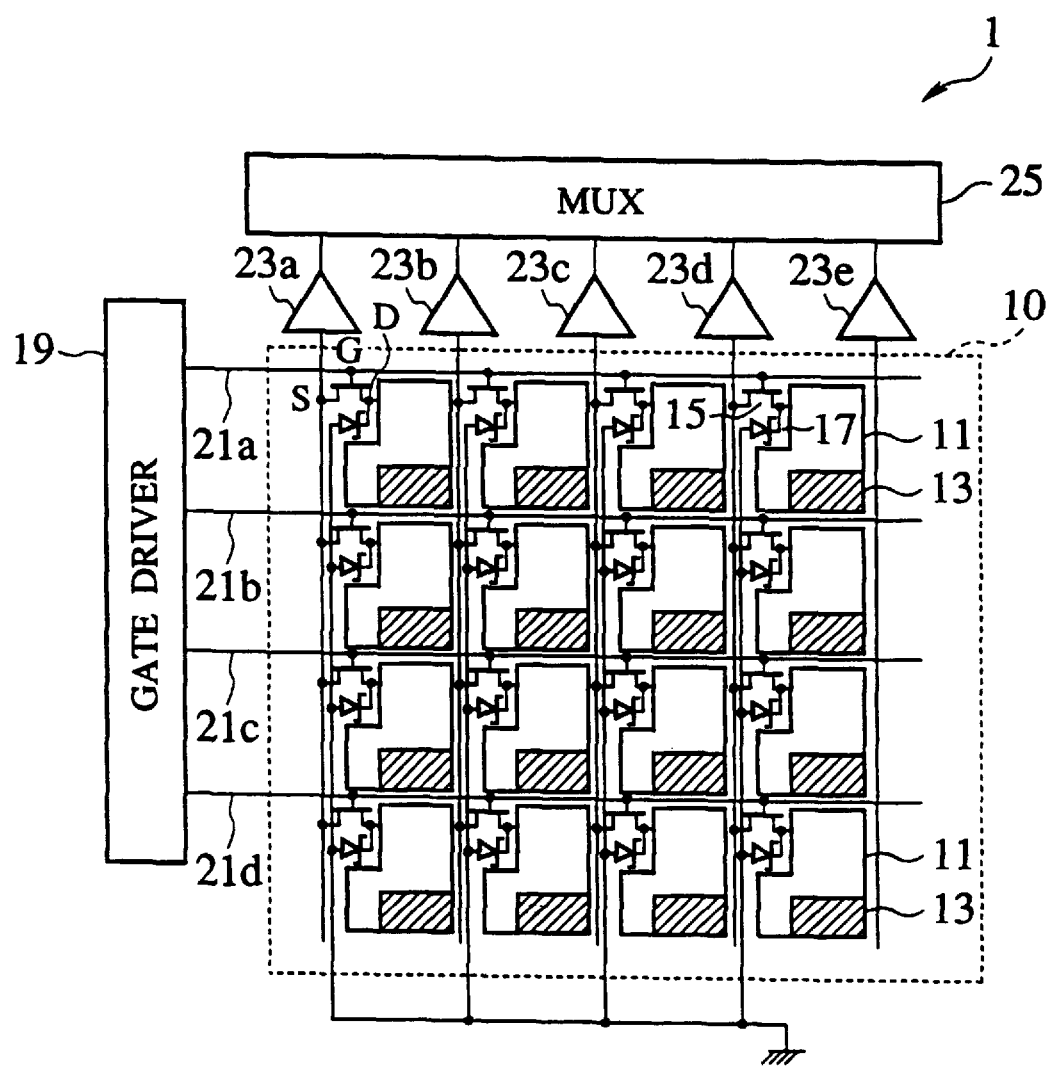
FIG. 1 is a diagram showing a general configuration of an X-ray imaging apparatus according to a first embodiment of the present invention.

FIG. 1 is a diagram showing a configuration of an X-ray imaging apparatus according to a first embodiment of the invention.

In FIG. 1, an X-ray imaging apparatus 1 comprises a flat panel X-ray detector 10, a gate driver 19, reading amplifiers 23a to 23e and a multiplexer(MUX) 25.

A plurality of pixel sections 11 constituting a charge conversion means including a plurality of pixels are two-dimensionally arranged on the detection surface of the flat panel X-ray detector 10. Each pixel section 11 includes a charge storage section 13 as a charge storage means, a TFT 15 as a charge reading means, and a zener diode 17 as a sweeping means.

Figure 2:
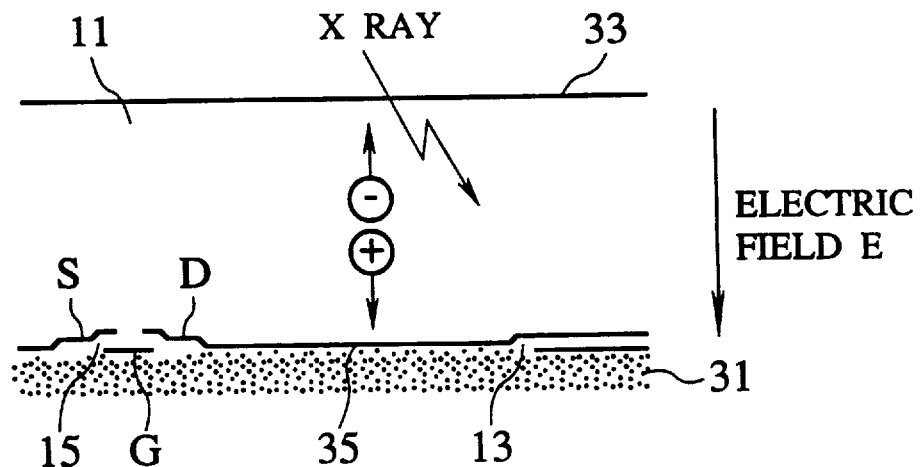
FIG. 2 is a sectional view of a single pixel of a flat panel X-ray detector.

FIG. 2 is a sectional view of a single pixel on the flat panel X-ray detector. In FIG. 2, the pixel section 11 is disposed above a substrate 31 between an upper electrode 33 and a lower electrode 35 for converting the incident X rays into charge.

In this configuration, amorphous-selenium (hereinafter called the a-Se) is used, for example, as an X-ray detection semiconductor making up the pixel section 11. The upper electrode 33 of the a-Se is supplied with a high potential, and an electric field E is generated from the upper electrode 33 toward the lower electrode 35. The negative charge generated in the a-Se by the X-ray irradiation is collected at the upper electrode 33 and the positive charge similarly generated is collected at the lower electrode 35.

The lower electrode 35 includes a charge storage section 13 having a capacitor connected in series for storing the charge generated in the a-Se.

A TFT 15, which is a kind of field effect transistor, is connected to the charge storage section 13 through the lower electrode 35. The TFT 15 is a reading SW for reading and applying the charge from the charge storage section 13 to the reading amplifiers 23a to 23e.

The TFT 15 operates as a switch adapted to turn on as the current flows between the drain D and the source S thereof when a gate control signal is applied to the gate G thereof from a gate driver 19 upon complete X-ray irradiation. After the X-ray irradiation, the charge having the X-ray image information stored in each pixel section 11 is read out by each of the external reading amplifiers 23a to 23e through the TFT 15.

The gate driver 19 includes four control lines 21a to 21d for producing a gate control signal. Each of the control lines 21a to 21d is connected to the gate G of the corresponding one of the four TFTs 15.

Each of the reading amplifiers 23a to 23d is connected to the source S of the four corresponding TFTs 15 for reading the charge from the four TFTs 15 of the corresponding column and applying them to the MUX 25.

The MUX 25 converts the parallel outputs from the reading amplifiers 23a to 23d to a serial output and applies it to an analog/digital (A/D) converter not shown.

Each zener diode 17 has the cathode C thereof connected to the drain D constituting the input terminal of the TFT 15, and is adapted to break down at a predetermined voltage lower than the breakdown voltage of the TFT 15 so that the charge supplied to the drain D of the TFT 15 from the charge storage section 13 are swept out to the earth. Each zener diode 17 is an element having a nonlinear resistance characteristic and is adapted to break down and allows a current to flow therethrough under an inverse bias voltage higher than a predetermined value applied thereto.

The structure of an X-ray imaging apparatus according to the first embodiment was explained above. The structure of an X-ray imaging apparatus except for that of the diode 17 is described, for example, in "X-ray imaging using amorphous selenium: Feasibility of a flat panel' selfscanned detector for digital radiology", by Wei Zhao et, al., Med. Phys. 1995.

The description in this thesis shows that when the a-Se is impressed with a voltage of several thousand volts, and irradiated with X-rays, the voltage across the a-Se drops whereas the voltage across the charge storage section 13 rises.

Figure 3:
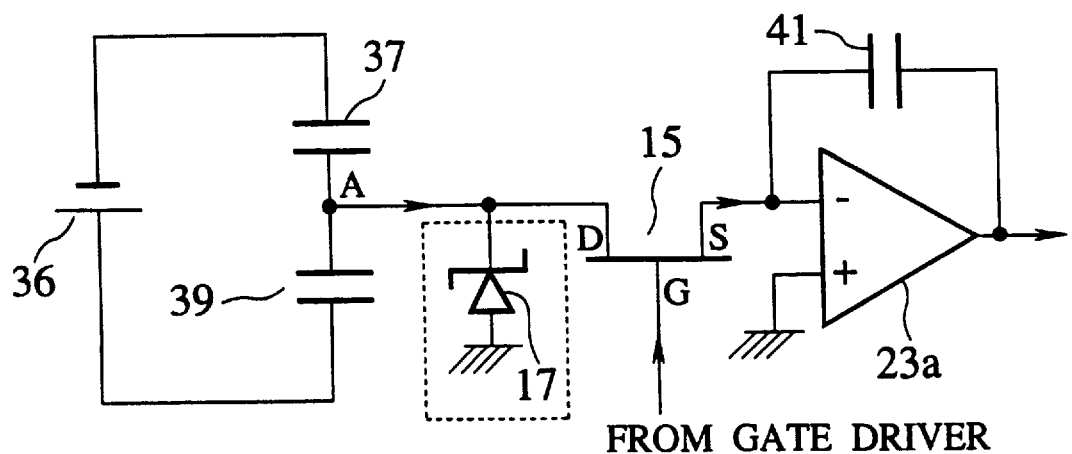
FIG. 3 is a diagram showing an electrical equivalent circuit of a single pixel according to the first embodiment.

Now, the operation of the first embodiment will be explained with reference to FIG. 3 showing an electrical equivalent circuit of a single pixel. During the X-ray irradiation, the applied voltage 36 is distributed between a voltage across a pixel section capacitor 37 of the pixel section 11 providing the a-Se and a voltage across a charge storage capacitor 39 of the charge storage section 13 in accordance with the charge generated in the a-Se by the incident X rays.

During the X-ray irradiation, the TFT 15 acting as a reading SW remains off while being supplied with the potential at point A. Under this condition, the potential difference between the pixel and the gate of the TFT 15 or the potential difference between the pixel and the reading amplifier 23a, whichever is higher, is applied directly to the TFT 15 as a load.

Upon complete X-ray irradiation, the charge representing the X-ray image information stored in each pixel section 11 is read out by the reading amplifier 23a through the TFT 15. In FIG. 3, a capacitor 41 is inserted between the inverted input terminal and the output terminal of the reading amplifier 23a as an integrated type.

In the case where the potential difference applied during the X-ray irradiation exceeds a predetermined level (generally, 50 to 100V), however, the TFT 15 is subjected to a dielectric breakdown.

For this reason, a zener diode 17 making up a nonlinear resistor adapted to break down at a predetermined voltage is arranged in parallel to the TFT 15 of each pixel of the flat panel detector 10, and one end of the zener diode 17 is set to a reference potential (say, GND).

In view of the fact that the breakdown voltage of the zener diode 17 is set to a level lower than the breakdown voltage of the TFT 15, any potential higher than the breakdown voltage of the TFT 15 which may be generated at point A flows to the reference potential side through the zener diode 17. As a result, the TFT 15 constituting the reading SW is protected from breakdown.

The first embodiment was explained above with the zener diode 17 taken as an example of a device having a nonlinear resistance characteristic. An embodiment can alternatively be configured, however using another TFT having a similar function to the zener diode. Such an embodiment will be described below.

Figure 4:
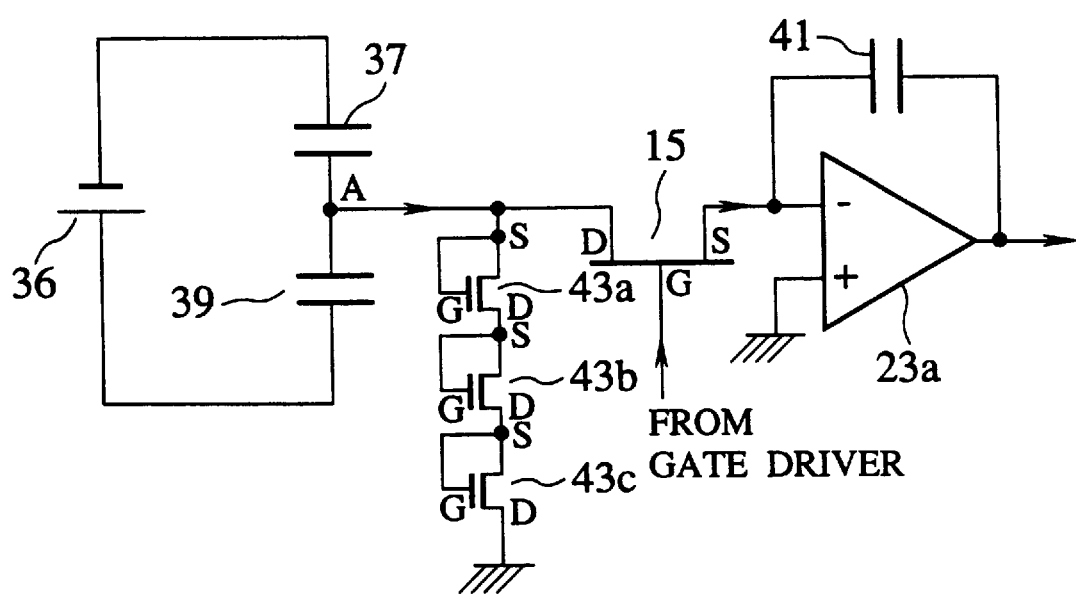
FIG. 4 is a diagram showing an electrical equivalent circuit of a single pixel of the X-ray imaging apparatus according to a second embodiment of the invention.

FIG. 4 shows an electrical equivalent circuit of a single pixel of an X-ray imaging apparatus according to a second embodiment. The example shown in FIG. 4 has a feature that three TFTs 43a to 43c are inserted in series between the drain D of the TFT 15 and the earth in place of the zener diode 17.

The gate G and the source S of each of the TFTs 43a to 43c are shorted to each other.

With the TFTs 43a to 43c of this configuration, the circuit between the gate G and the drain D exhibits a divide function, so that upon application of a predetermined voltage to the gate G, a voltage breakdown occurs. In other words, this configuration has the same function as the zener diode 17, and therefore the TFT 17 is protected from breakdown. Instead of three TFTs, one or two TFTs of such a configuration can be included, or, in the case that the polarity of an applied voltage at point A is reversed, the gate G can be connected with the drain D instead of with the source S to produce a similar effect.

Figure 5:
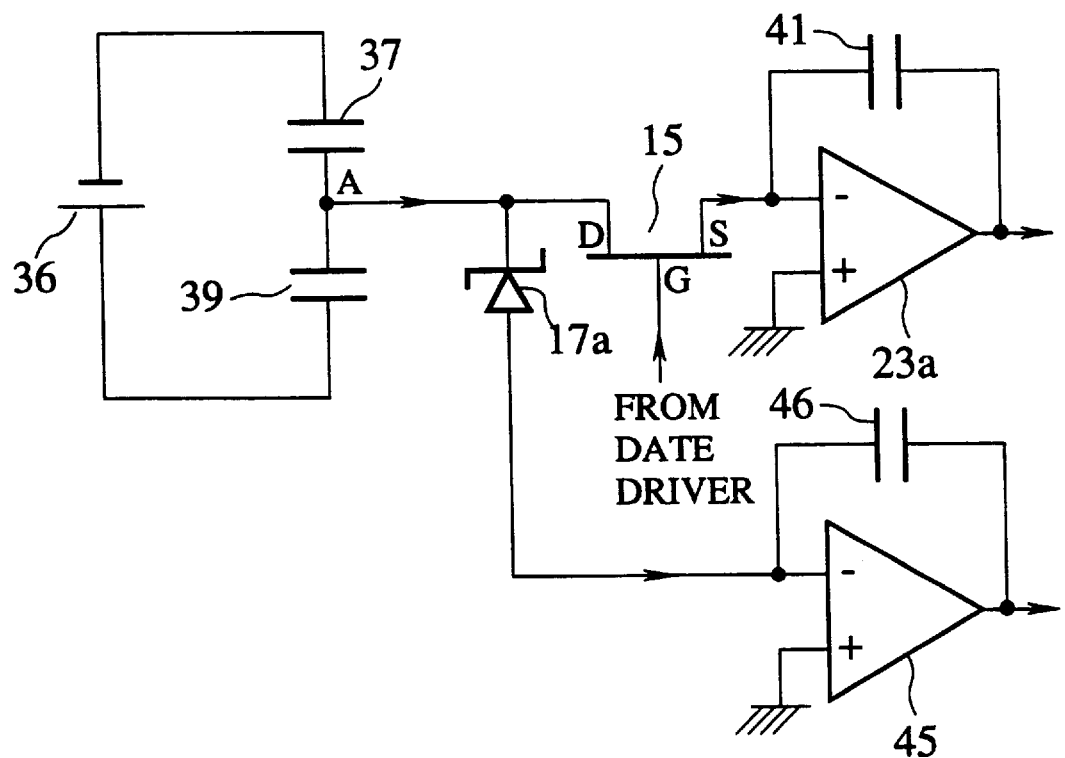
FIG. 5 is a diagram showing an electrical equivalent circuit of a single pixel of the X-ray imaging apparatus according to a third embodiment of the invention.

FIG. 5 is a diagram showing an electrical equivalent circuit of a single pixel of an X-ray imaging apparatus according to a third embodiment of the invention.

This embodiment, in addition to the configuration of the first or second embodiment, comprises a component part capable of reading the charge that flows out when a device having a nonlinear resistance characteristic breaks down. The X rays which may be irradiated by more than a necessary amount can thus be monitored.

The configuration of the third embodiment will be explained with reference to FIG. 5. This embodiment comprises a zener diode 17a with the cathode thereof connected to the drain D of the TFT 15, a reading amplifier 45 making up a charge retrieval means connected to the anode of the zener diode 17a and a capacitor 46 inserted between the inverted input terminal and the output terminal of the reading amplifier 45.

The configuration of the other component parts of this embodiment is identical to that of the corresponding ones of the first embodiment shown in FIG. 3, and therefore will not be described with the same reference numerals attached to such components, respectively.

The zener diode 17a breaks down at a predetermined voltage and thus sweeps out to the reading amplifier 45 the charge supplied to the drain D of the TFT 15 from the charge storage section 13. The reading amplifier 45 retrieves the charge swept out of the zener diode 17a.

The breakdown voltage of the zener diode 17a is so set that the zener diode 17a breaks down when saturated X rays are entered. In the circuit of FIG. 5, once the breakdown voltage of the zener diode 17a is set to a level substantially equal to the voltage at point A when saturated X rays are entered, the zener diode 17a breaks down when saturated X rays are entered. The amount of the saturated X rays means such a value that the output of the A/D converter 83 does not properly correspond to the amount of X ray irradiation if the amount of X ray irradiation exceeds the value. There are some reasons why the output of A/D converter 83 does not properly correspond to the amount of X ray irradiation. One is the case that an analog voltage input to the A/D converter 83 exceeds a range of the A/D converter 83. Another is the case that the linear characteristics of "amount of incident X ray-output voltage of the charge storage section" is not best.

If the breakdown voltage is thus set, when the amount of incident X ray irradiation reaches more than the amount of the saturated X rays, the zener diode 17a breaks down and the voltage applied to the input of the reading amplifier 45 can be changed. Accordingly, upon detecting this change, it is recognized that the amount of incident X ray irradiation reaches the amount of the saturated X rays. Moreover, for example, by changing the display state of an external display unit in accordance with the output of the reading amplifier 45, an operator can recognize that the amount of incident X ray irradiation reaches the amount of the saturated X rays.

The irradiation or non-irradiation of X rays by more than the normal amount can be monitored by the above-mentioned configuration. In the case where X rays more than the saturated incident X rays are applied to a pixel, for example, it can be decided that an abnormal amount of X rays has been irradiated. Also, the presence or absence of a pixel that has generated the charge by more than the saturated charge amount can be detected without adversely affecting the dynamic range of the detector.

FIG. 6 is a diagram showing a general configuration of an X-ray imaging apparatus according to the third embodiment of the invention.

In an X-ray imaging apparatus 2 comprising a flat panel X-ray detector 10a shown in FIG. 6, the drain D of each of the TFTs 15 is connected with the cathode of the corresponding zener diode 17a of each pixel. The anodes of all the zener diodes 17a are connected to a common reading amplifier 45.

In this way, the anodes constituting an end of the zener diode 17a of each pixel are collected together into one.

The X-ray imaging apparatus 2 further comprises a control unit 47, an X-ray generation unit 49 and a display lamp 51. The control unit 47 controls the X-ray generation unit 49 according to the output of the reading amplifier 45. The X-ray generation unit 49 controls the X-ray dosage based on the control signal from the control unit 47. The display lamp 51 displays the output of the reading amplifier 45.

With this configuration, the output of the reading amplifier 45 is produced in the case where an X ray exceeding a saturated charge capacity enters even a single pixel of the imaging apparatus.

This output is applied to the control unit 47, and the X-ray generation unit 49 cuts off the X rays in accordance with the output amount. The display lamp 51 can simply display the existence of a saturated region.

FIG. 7 is a diagram showing a general configuration of an X-ray imaging apparatus according to a fourth embodiment of the invention.

In an X-ray imaging apparatus 3 comprising a flat panel X-ray detector 10a of FIG. 7, the whole 16-pixel detector is divided into four 2×2 blocks of BK1, BK2, BK3 and BK4, for example, in each of which the anodes constituting an end of each zener diode 17a of each pixel are unified.

The anodes of the zener diodes 17a of the pixels in the block BK1, for example, are connected to a common reading amplifier 45-1, and the anodes of the zener diodes 17a of the pixels in the block BK2 are connected to a common reading amplifier 45-2.

In similar fashion, the anodes of the zener diodes 17a of the pixels in the block BK3 are connected to a common reading amplifier 45-3, and the anodes of the zener diodes 17a of the pixels in the block BK4 are connected to a common reading amplifier 45-4.

The outputs of the reading amplifiers 45-1 to 45-4 are connected to the control unit 47 and the display lamp 51. The configuration of the control unit 47, the X-ray generation unit 49 and the display lamp 51 is identical to that of the third embodiment.

With this configuration, upon entrance of X rays in an amount exceeding the saturated charge capacity into a block of the detector, an output is produced from the reading amplifier corresponding to the particular block. The saturation or non-saturation of each of the four blocks can thus be determined.

In clinical applications, there are some regions other than the region of interest, where X rays cannot be applied sufficiently effectively. For achieving a proper density of the region of interest, therefore, a part of the image may be unavoidably saturated.

A more detailed irradiation control becomes possible by selecting and using only the signal information for the intended portion out of the four pieces of information on the saturation or non-saturation and thus by controlling the X-ray generation unit 49.

Alternatively, information actually indicating a halation region is prepared from the four outputs and displayed on the display lamp 51. Further, the 16 pixels can be divided into portions of any number other than four. A reading lamp can be provided for each pixel, for example, to determine the saturation or non-saturation of each pixel.

Furthermore, the information can be announced by an alarm buzzer or the like instead of being displayed on the display lamp 51.

According to the above-mentioned embodiment, each pixel is adapted to convert the incident X ray into charge, each charge storage section stores the charge thus converted, and each TFT reads out the stored charge. Also, each zener diode sweeps out the charge stored in the charge storage section when the voltage applied thereto exceeds a predetermined level lower than the breakdown voltage of the TFT.

In other words, the charge is swept out utilizing the breakdown voltage characteristic of the zener diode before reaching the voltage at which the TFT is broken. Therefore, the TFT is not broken down even in the case where a high voltage can be applied to the pixels due to the charge during the X-ray irradiation.

Also, each pixel converts the incident X rays into charge, each charge storage section stores the charge thus converted, and each TFT reads out the charge thus stored. Each zener diode sweeps out the charge stored in the charge storage section when the voltage applied thereto exceeds a predetermined level set in the neighborhood of the charge saturation voltage of each pixel, and the amplifier retrieves the charge thus swept out. The X-ray irradiation can thus be monitored. Especially, the irradiation or non-irradiation of an abnormal amount of X rays can be monitored.

Further, since each amplifier adds each charge swept out of the zener diode corresponding to each pixel in each block, the saturation information is output to the display unit in the case where at least one of the pixels in the block is supplied with X rays exceeding the saturated incident X-ray amount.

Consequently, a block which has been entered by X rays more than the saturated incident X-ray amount can be identified. Also, the X-ray irradiation for the particular block can be controlled by the control unit according to the saturation information.

Next, a configuration further improved by use of a TFT as a protection circuit which sweeps out the charge stored in the charge storage section will be discussed.

The characteristic of the TFT described above is determined by the gate-source potential difference (Vgs). There is not any structural difference between drain and source, however, and the voltage at one of the two terminals of the drain and the source which is lower in potential constitutes a physically significant source.

Figure 8A:
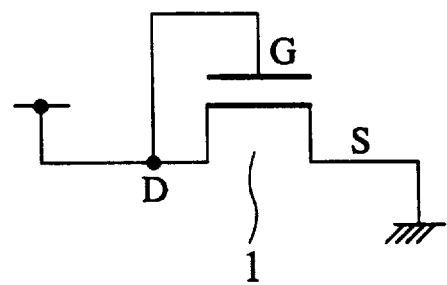
FIGS. 8A and 8B are diagrams for explaining the characteristics of the TFT.
Figure 8B:
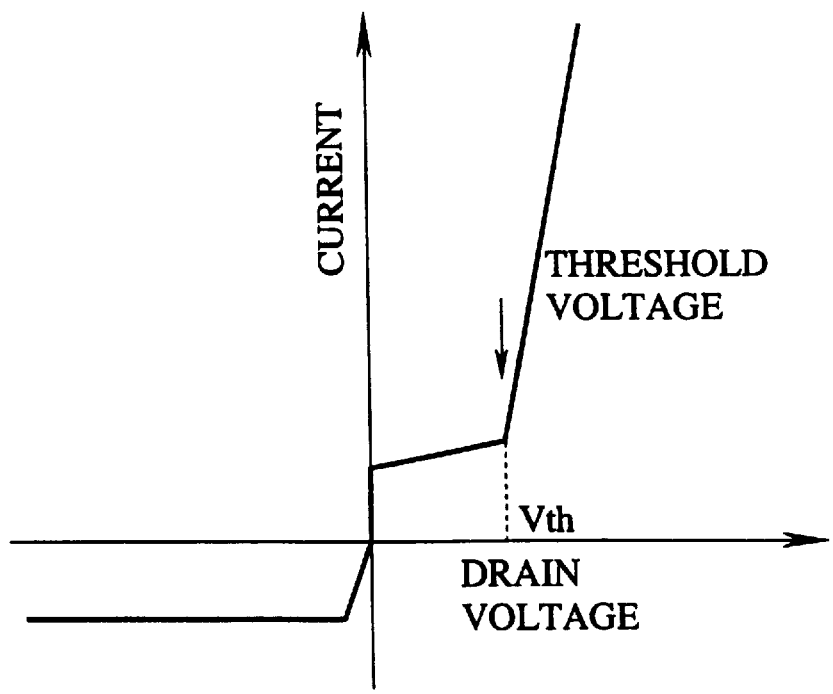

A diode simulation circuit using this type of TFT and the characteristics of such a circuit are shown in FIGS. 8A and 8B, respectively. In FIG. 8A, the drain D and the gate G of the TFT 100 are connected to each other, and the source S is connected to GND. Then, the current flowing in the TFT 100 undergoes a change in accordance with the voltage of the drain D.

The drain voltage Vd, when positive, is higher than the source voltage Vs, and therefore the source S constitutes a source in the physical sense of the term. In this case, Vgs=Vg−Vs=Vd−Vs≧0. With the increase in Vd, therefore, Vgs increases also and the current-voltage characteristic changes accordingly. As shown in FIG. 8B, when Vgs exceeds a threshold voltage Vth, the current suddenly increases.

In the case where the drain voltage Vd is negative, on the other hand, the voltage Vs of the source in the physical sense of the term higher than the drain voltage Vd, and therefore the source provides the drain D terminal. Under this condition, Vgs=Vg−Vd=0. Even when Vd decreases, Vgs remains at zero. Thus Vgs remains unchanged, so that the current is not substantially changed. As a result, as shown in FIG. 8B, this circuit exhibits a characteristic similar to that of a diode.

In spite of this, it is difficult to control the threshold voltage Vth of the TFT 100 in the fabrication process. The threshold voltage, therefore, has so far been impossible to set to an arbitrary level regardless of the size of the TFT.

Specifically, in the case where the threshold voltage is lower than a voltage level in the normal operation region (i.e., the maximum value of the voltage due to the charge stored in the charge storage section read out as a pixel signal by the charge reading section, also called the maximum read voltage), the breakdown undesirably occurs within the range of the normal operation voltage, thereby making it impossible to retrieve the pixel signal accurately. As a result, it has so far been necessary to set the threshold voltage at a level higher than the normal operation voltage in the case where the TFT is used as a protection circuit.

On the other hand, the characteristics of the TFT 100 are such that the current flowing from drain to source assumes a minimum value, not when Vgs=0, but when Vgs has predetermined voltage level lower than zero.

Nevertheless, the conventional method utilizes only the region where Vgs≧0. The result is that in the case where the TFT is used as a protection circuit, the leakage current in the normal operation voltage region is not of a minimum value, and therefore no accurate pixel signal can be produced. Consequently, an accurate image cannot be readout, thereby making it necessary to suppress the leakage current to a sufficiently small level.

An embodiment for solving the above-mentioned problem is explained below.

FIG. 9 is a diagram showing a general configuration of an X-ray imaging apparatus according to a fifth embodiment of the invention.

The X-ray imaging apparatus shown in FIG. 9 is an image apparatus of pixel charge transfer type comprising a flat panel X-ray detector 10b, a vertical shift register 65, a reading amplifier 68 and a multiplexer 69.

A plurality of pixels are arranged two-dimensionally on the detection surface of the flat panel of the flat panel X-ray detector 10b. Each pixel includes a photoelectric conversion section 55 as a charge conversion means, a charge storage section 56 as a charge storage means, a protective TFT 57 as a sweeping means, and a TFT 64 as a charge reading means. Each thin-film transistor TFT is composed of a field effect transistor.

The photoelectric conversion section 55 is for converting the incident light or the incident X rays into charge, and generates charge corresponding to the incident light or the incident X rays, as the case may be. The photoelectric conversion section 55 is represented by a capacitor as an electrical equivalent circuit as shown in FIG. 9. The storage capacity section 56 is for storing the charge generated in the photoelectric conversion section 55 and is represented by a capacitor as an electrical equivalent circuit as shown in FIG. 9.

The photoelectric conversion section 55, which is composed of selenium, for example, for converting X rays directly into charge, is not limited to being just selenium. In using selenium, it is necessary to apply a voltage of several KV across a selenium film. In the case where a strong X ray is irradiated, therefore, the storage capacity section 56 is also liable to be supplied with several KV.

Each charge storage section 56 is connected with a transfer TFT 64. The transfer TFT 64 is a reading SW permitting the reading amplifier 68 to read the charge stored in the charge storage section 56 through a read signal line 67.

After complete X-ray irradiation, the transfer TFT 64 has the gate G thereof supplied with a gate control signal from a vertical shift register 65 through a vertical select line 66, so that the circuit between the drain D and the source S thereof is turned on. The transfer TFT 64 thus functions as a switch. Upon complete X-ray irradiation, the charge containing the X-ray image information stored in each pixel is read out by the external amplifier 68 through the transfer TFT 64.

Each vertical select line 66 is connected to the gates G of the three transfer TFTs 64 on a corresponding row. Each reading amplifier 68, on the other hand, is connected to the drains D of the three transfer TFTs 64 on a corresponding column. The reading amplifier 68 thus reads out the charge from the three transfer TFTs 64 on the corresponding column and applies them to a multiplexer 69.

A capacitor 68b is interposed between the inverted input terminal and the output terminal of each reading amplifier 68 as an integrated type. The multiplexer 69 converts the parallel outputs of the reading amplifiers 68 into a serial output and applies it to an analog/digital (A/D) converter not shown.

Each protective TFT 57 constitutes a protective circuit for preventing the signal voltage due to the charge stored in the storage capacity section 56 from abnormally increasing. The drain and the gate of the TFT 57 are directly connected (shorted) to each other, an end of the drain-source circuit is connected to a voltage-variable terminal of the storage capacity section 56 of each pixel (a point intermediate between the photoelectric conversion section 55 and the storage capacity section 56). A fixed potential terminal 60 making up the other end of the protective TFT is set at a predetermined fixed potential.

In the example shown in FIG. 9, each protective TFT 57 has the drain D thereof making up an end thereof connected to the source S on the input side of the transfer TFT 64, and has the drain and the gate thereof directly connected (shorted) to each other. A positive fixed potential of s [V] is set to the fixed potential terminal 60 of the source S.

Each protective TFT 57 is a device having a nonlinear resistance characteristic, and upon application thereto of a voltage equal to or higher than a predetermined threshold level lower than the breakdown voltage of the transfer TFT 64, a current suddenly begins to flow and the charge supplied to the source S of the transfer TFT 64 from the charge storage section 56 is swept out.

Now, the operation of the fifth embodiment configured as described above will be explained. During the X-ray irradiation, the voltage applied to this imaging apparatus is distributed between the voltage across the capacity of the photoelectric conversion section 55 and the voltage across the capacity of the charge storage section 56. After completion of X-ray irradiation, the charge representing the X-ray image information stored in each storage capacity section 56 is read out by the reading amplifier 68 through the transfer TFT 64.

The threshold voltage of the protective TFT 57 is set lower than the breakdown voltage of the transfer TFT 64. Even if a potential equal to or higher than the breakdown voltage of the transfer TFT 64 is generated in the storage capacity section 56, therefore, it is difficult for a current to flow through any one of the protective TFTs 57. As a result, the transfer TFT 64 making up a reading SW is protected from breakage.

Figure 10:
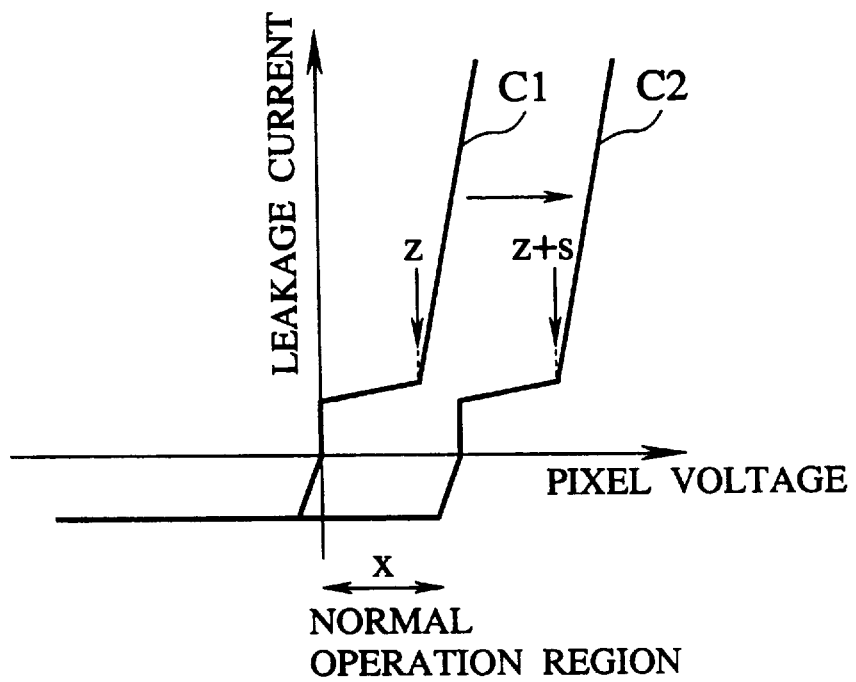
FIG. 10 is a diagram showing the characteristics of the protective TFT according to the fifth embodiment.

In the case where the gate G and the drain D of the protective TFT 57 are shorted to each other with the source S thereof connected to GND, the drain voltage (pixel voltage) and the current assumes a current characteristic curve C1 as shown in FIG. 10. The threshold voltage (breakdown voltage) is the one at which a current suddenly begins to flow, and takes a substantially constant value regardless of the size of the protective TFT 57.

Now, assume that the pixel voltage of 0 to x [V] shown in FIG. 10 is used as a normal operating voltage (x [V] is hereinafter called the maximum read voltage) and that signals higher than the normal operating voltage x [V] are not required. The threshold voltage y [V] of the TFT 57 making up a protective circuit is required to be higher than x [V].

In the case where the source S of the TFT 57 making up a protective circuit is connected to GND, however, the prevailing threshold voltage assumes a value of z [V] as shown in the current characteristic curve C1 in FIG. 10, which voltage z [V] is often lower than x [V].

In view of this, according to the fifth embodiment, a positive fixed potential of s [V] is set at the fixed potential terminal 60 of the source S of the protective TFT 57 by a constant voltage source (not shown). As a result, the pixel voltage and the pixel current assume a current characteristic curve C2 as shown in FIG. 10, and the apparent threshold voltage is given as $$y = z + s [V]$$

In other words, the source voltage of the protective TFT 57 is set to change the threshold voltage by changing the voltage of the constant voltage source in such a manner as to hold the relation s > x − z. When the voltage applied to the storage capacity section 56 reaches or exceeds the normal operating voltage x [V], the TFT 57 making up a protective circuit is turned on.

In this way, an accurate pixel signal can be produced since the protective TFT 57 is not broken down under the normal operating voltage x [V].

Also, at the same time that the apparent threshold voltage y is increased, the leakage current in the normal operation range can also be reduced from a value associated with Vgs of several volts to a value associated with Vgs smaller than zero, as seen from FIG. 10.

In the event that the voltage across the storage capacity section 56 drops abnormally, the drain-source connection of the protective TFT 57 is required to be reversed.

An increased source voltage of the protective TFT 57 can shift the characteristic of the pixel voltage versus the leakage current while at the same time increasing the apparent threshold voltage and thus can reduce the leakage current in the normal operation region.

As a result, the signal required as a pixel signal can be accurately read, and the pixel signal is prevented from increasing abnormally beyond the breakdown voltage of the TFT 57 thereby to avoid the breakdown of the TFT.

Figure 11:
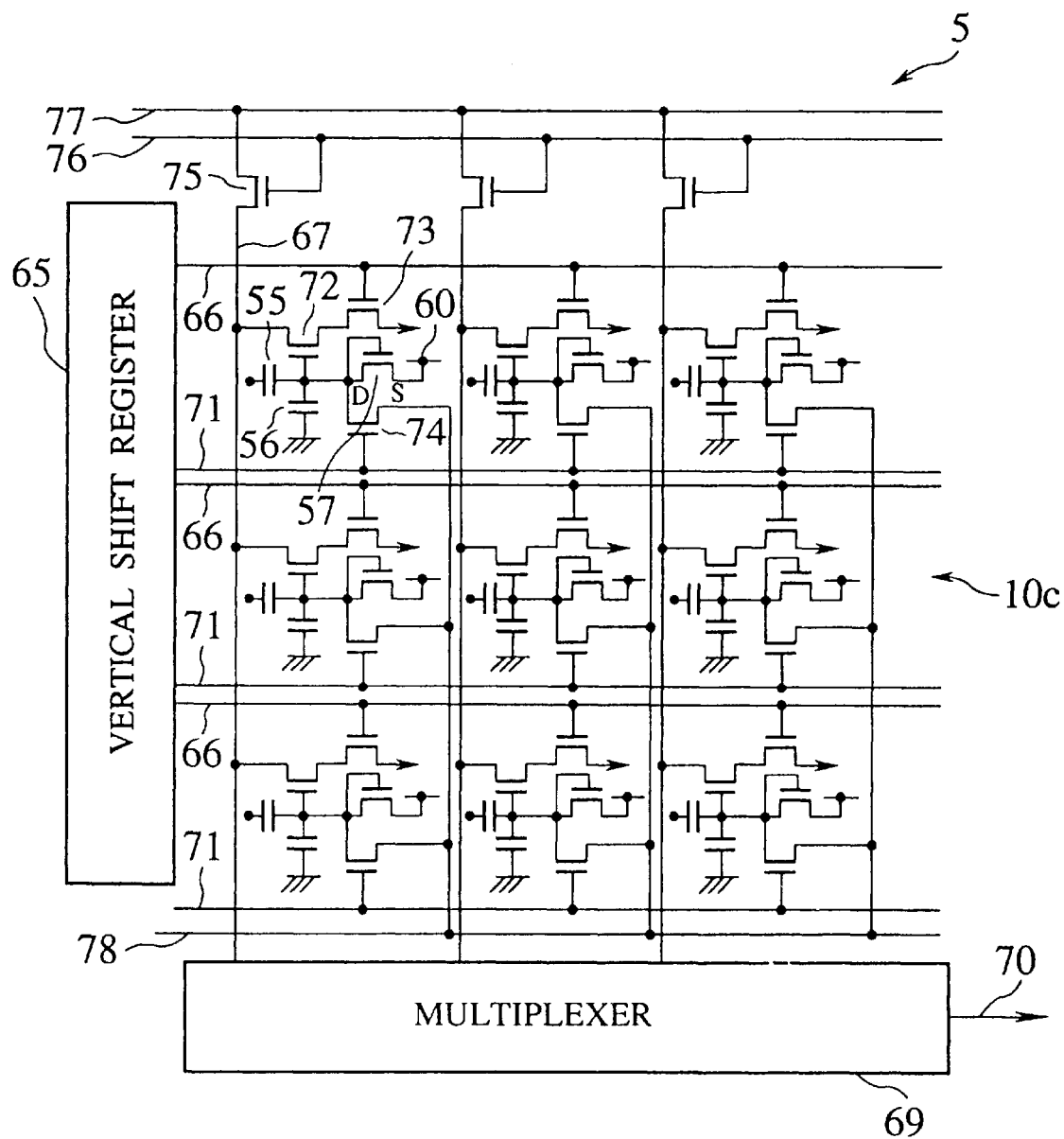
FIG. 11 is a diagram showing a general configuration of an X-ray imaging apparatus according to a sixth embodiment of the present invention.

FIG. 11 is a diagram showing a general configuration of an X-ray imaging apparatus according to a sixth embodiment of the invention.

An X-ray imaging apparatus 5 shown in FIG. 11 is of a pixel signal amplification type and comprises a flat panel X-ray detector 10c, a vertical shift register 65 and a multiplexer 69.

Each pixel on the flat panel of the flat panel X-ray detector 10c includes a photoelectric conversion section 55, a charge storage section 56, a protective TFT 57, an amplification TFT 72, a vertical select TFT 73 and a reset TFT 74.

Each protective TFT 57 makes up a protective circuit for preventing the signal voltage due to the charge stored in the storage capacity section 56 from increasing abnormally. The drain and the gate of each protective TFT 57 are connected directly (shorted) to each other, and an end of the drain-source circuit is connected to a voltage-variable terminal of the storage capacity section 56 of each pixel. The fixed potential terminal 60 of the source of the protective TFT 57 is set to a fixed potential of s [V] by a constant voltage source.

An end of each charge storage section 56 is connected to the gate G of the corresponding amplification TFT 72 for amplifying the charge stored in the charge storage section 56, the source S of the amplification TFT 72 is connected to a read signal line 67 for reading the stored charge, and the drain D of the amplification TFT 72 is connected to the source S of the vertical select TFT 73.

The gate G of each loading TFT 75 is connected to a gate line 76, the source S of the loading TFT 75 is connected to a source line 77, and the drain D of the loading TFT 75 is connected to the read signal line 67. Each loading TFT 75 is connected to the sources S of three amplification TFTs 72 corresponding to three lines (three rows). The voltage Vgs of the loading TFT 75 has the same value as the voltage Vgs of the amplification TFT 72, so that a current flows from the loading TFT 75 to the amplification TFT 72.

The gates G of the three vertical select TFTs 73 for each row are connected to the vertical select line 66 from the vertical shift register 65. The vertical select TFT 73 turns on between the drain D and the source S thereof and thus operates as a switch upon application of a gate control signal to the gate G thereof from the vertical shift register 65 upon complete X-ray irradiation, thereby causing a current to flow in the amplification TFT 72 from the loading TFT 75.

When the three vertical select TFTs 73 on a given row turn on, each of the three amplification TFTs 72 on the particular row reads the charge from the TFTs 57 and produces an output signal to the multiplexer 69 through the read signal line 67.

The gate G of each reset TFT 74 is connected with a reset line 71 from the vertical shift register 65, the source S of the reset TFT 74 is connected with the drain D of the protective TFT 57, and the drain D of the reset TFT 74 is connected with a reset line 78. The charge of the protective TFT 57 is reset by each reset TFT 74 for each row.

The multiplexer 69 converts the parallel outputs from the three amplification TFTs 72 into a serial output for each row and applies it to an analog/digital (A/D) converter not shown.

In an X-ray imaging apparatus according to the sixth embodiment configured as described above, a positive fixed potential s [V] is set at the fixed potential terminal 60 of the source S of the protective TFT 57 by a constant voltage source. As a result, the pixel voltage and the pixel current exhibit a current characteristic curve C2 as shown in FIG. 10, in which the apparent threshold voltage is given as $$y = z+s [V]$$

In other words, the source voltage of the protective TFT 57 is set thereby to change the threshold voltage by changing the voltage of the constant voltage source in such a manner as to hold the relation s>x−z. When the voltage applied to the storage capacity section 56 reaches or exceeds the normal operating voltage x [V], the TFT 57 constituting a protective circuit is turned on.

This is equivalent to saying that an accurate pixel signal can be produced for the reason that the protective TFT 57 is not subjected to a voltage breakdown within the normal operating voltage x [V].

Also, as seen from FIG. 10, the leakage current in the normal operating region can be reduced from a value associated with about a voltage value Vgs of several volts to a value associated with a voltage value Vgs lower than zero while at the same time increasing the apparent threshold voltage y.

In the case where the voltage across the storage capacity section 56 drops abnormally, the drain-source connection of the protective TFT 57 is required to be reversed. Also, the present invention is not limited to the imaging apparatus of pixel charge transfer type shown in FIG. 9 or the imaging apparatus of pixel signal amplification type shown in FIG. 11 as a means of reading the signals.

Further, although the fifth and sixth embodiments concern the case in which the drain and the gate of the protective TFT 57 are shorted to each other, a zener diode, for example, can be used in place of each protective TFT 57. In such a case, the anode of the zener diode is connected to the voltage-variable terminal of the storage capacity section 56 and the cathode is set to a fixed potential of s [V]. The same effect as the fifth and sixth embodiments can thus be obtained.

Figure 12:
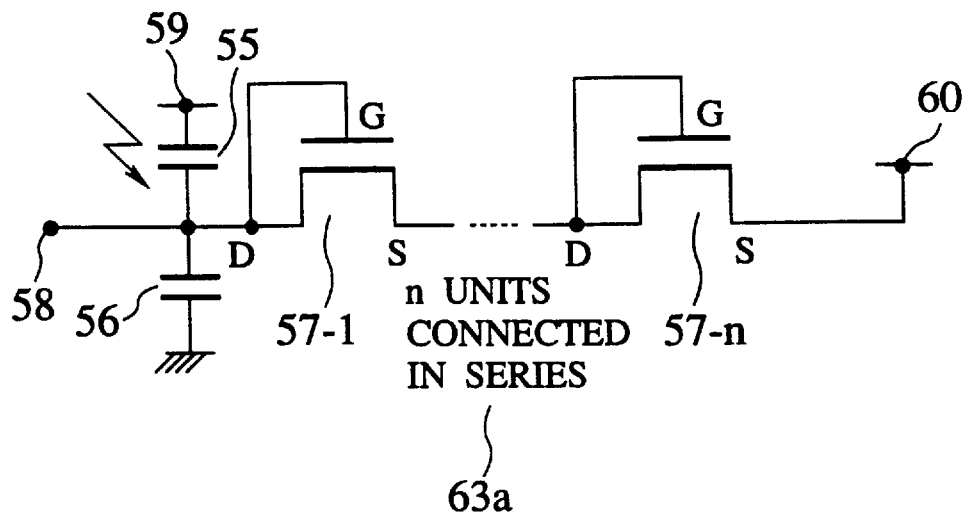
FIG. 12 is a diagram showing a protective circuit according to the seventh embodiment.

Now, explanation will be made about an X-ray imaging apparatus according to a seventh embodiment of the invention. FIG. 12 is a diagram showing a configuration of a protective circuit according to the seventh embodiment.

A protective circuit 63a shown in FIG. 12 is provided for each pixel and includes a plurality of protective TFTs 57-1 to 57-n for preventing the signal voltage across the storage capacity section 56 from increasing abnormally.

Each of the protective TFTs 57-1 to 57-n has the drain D and the gate G thereof shorted and connected in series to each other. The drain D constituting an end of the protective TFT 57-1 is connected to the voltage-variable terminal of the storage capacity section 56, and the source S making up the other end of the protective TFT 57-n is set to a fixed potential of s [V]. The photoelectric conversion section 55 has the same configuration as that of the fifth embodiment.

The configuration of the remaining component parts of the seventh embodiment is identical to that of the fifth embodiment, and therefore will not be described in detail.

Also, the method of reading the signals is not limited to the present embodiment, but can be implemented by the X-ray imaging apparatus of pixel charge transfer type according to the fifth embodiment shown in FIG. 9 or by the X-ray imaging apparatus of pixel signal amplification type according to the sixth embodiment shown in FIG. 11 with equal effect.

Now, explanation will be made about the operation of a plurality of the protective TFTs 57-1 to 57-n making up the essential parts of the X-ray imaging apparatus having the above-mentioned configuration according to the seventh embodiment.

Figure 13:
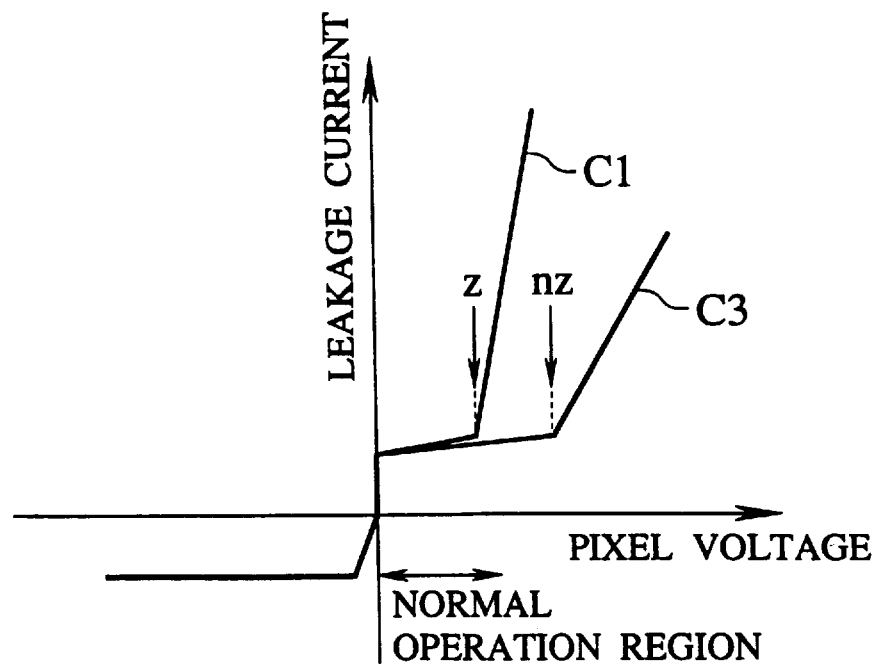
FIG. 13 is a diagram showing the characteristics of the protective TFT according to the seventh embodiment.

First, with the gate G and the drain D of each protective TFT 57 shorted to each other and the source S thereof connected to GND, the drain voltage and the drain current assume a current characteristic curve C1 as shown in FIG. 13 (representing the same characteristic as the current characteristic curve C1 in FIG. 10). Also, the threshold voltage is z [V] when the source S of a single protective TFT 57 is connected to GND, which voltage z [V] is often lower than x [V].

Assume that n protective TFTs 57-1 to 57-n are connected in series with the gate G and the drain D of each thereof shorted to each other. The corresponding threshold voltage is about n times higher than the threshold voltage associated with a single protective TFT 57. In other words, the drain voltage and the drain current assume a current characteristic curve C3 as shown in FIG. 13, and the apparent threshold voltage is given as $$y = nz [V]$$

If the number of the protective TFTs 57 to be connected in series is set in such a manner that n>x/z, therefore, the protective TFTs 57-1 to 57-n can be turned on when the voltage applied to the storage capacity section 56 exceeds the normal operating voltage x [V].

In this way, the protective TFTs 57-1 to 57-n are not subjected to voltage breakdown in the normal operating voltage range of x [V], and therefore an accurate pixel signal can be produced.

In the case where the voltage across the storage capacity section 56 drops abnormally, the connection between the drain and the source of each of the protective TFTs 57-1 to 57-n is required to be reversed.

As described above, the threshold voltage can be increased by connecting a plurality of protective TFTs 57 in series.

Instead of connecting a plurality of the protective TFTs 57 in series as in the above-mentioned embodiment, a plurality of zener diodes can be connected in series. In such a case, the anode of the first zener diode is connected to the voltage-variable terminal of the storage capacity section 56, and the cathode of the last zener diode is set to a fixed potential of s [V], thereby producing a similar effect to the above-mentioned embodiment.

Now, explanation will be made about an X-ray imaging apparatus according to an eighth embodiment of the invention. First, the TFT has such characteristics that the current takes a minimum value not when Vgs=0 but when Vgs is a predetermined voltage smaller than zero. The conventional method, however, utilizes only the region where Vgs≧0.

In view of this, the eighth embodiment employs a structure which operates while meeting the condition that Vg−Vd=a constant<0. In other words, the protective circuit according to the eighth embodiment utilizes the region where Vgs<0.

Figure 14:
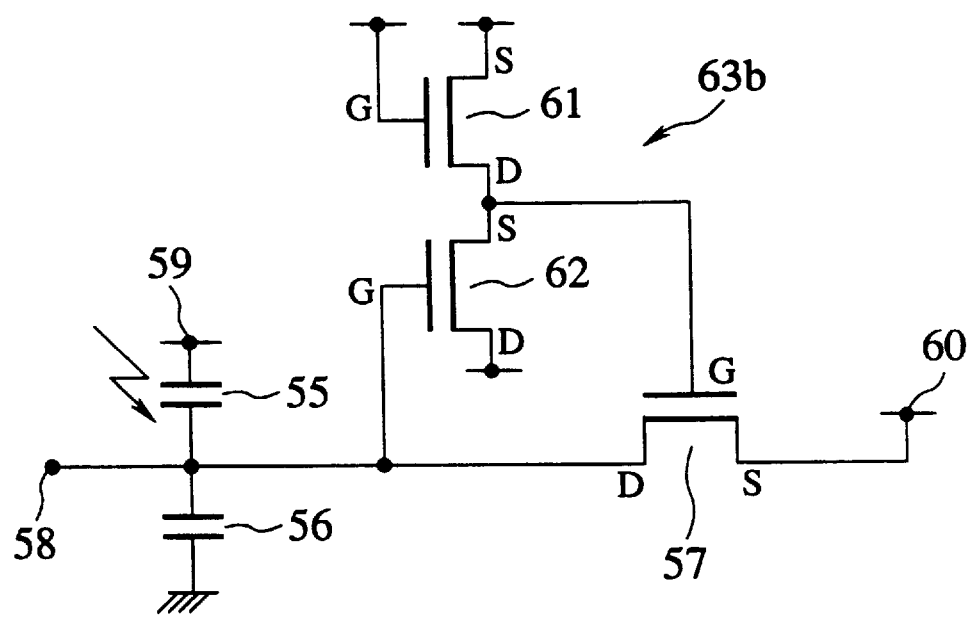
FIG. 14 is a diagram showing a protective circuit according to an eighth embodiment.

FIG. 14 is a diagram showing a configuration of a protective circuit according to the eighth embodiment. A protective circuit 63b shown in FIG. 14 includes a protective TFT 57 for preventing the signal voltage of the storage capacity section 56 from increasing abnormally, a control TFT 61 and a voltage transforming TFT 62. These TFTs are included in each pixel.

The drain D of the control TFT 61 is connected to the source S of the voltage transforming TFT 62, and the drain D of the protective TFT 57 is connected to the gate G of the voltage transforming TFT 62. Also, the gate G of the protective TFT 57 is connected to the source S of the voltage transforming TFT 62.

An end (say, the drain D) of the drain-source circuit of the protective TFT 57 is connected to the voltage-variable terminal of the storage capacity section 56 of each pixel, and the fixed potential terminal 60 at the other end (say the source S) of the protective TFT 57 is set to a predetermined fixed potential by a constant voltage source not shown.

The control TFT 61 and the voltage transforming TFT 62 make up a series-connected source follower circuit and a potential difference generation means for generating a predetermined potential difference between the drain and the gate of the protective TFT 57. An always constant negative potential (Vg–Vd=Constant<0) is thus maintained. The threshold voltage can be changed by changing the potential difference generated by this potential difference generation means. The configuration of the control TFT 61 and the voltage transforming TFT 62 will be explained below.

The current flowing in the TFTs 61 and 62 is determined not by the voltage Vds but by the gate-source voltage $Vgs_{61}$ of the control TFT 61. Now, assuming that an arrangement is made to cause substantially no current to flow from the source S of the voltage transforming TFT 62 to the gate G of the protective TFT 57, the current flowing in the control TFT 61 assumes the same value as the current flowing in the voltage transforming TFT 62.

Due to the characteristics described above, if the current flowing in the control TFT 61 is to be the same as the current flowing in the voltage transforming TFT 62, the voltage Vgs of the control TFT 61 is required to assume the same value as the voltage Vgs of the voltage transforming TFT 62.

The voltage $Vs_{62}$ thus is determined in such a manner as to hold the relation $Vgs_{61}=Vgs_{62}=Vg_{62}-Vs_{62}$ even when the voltage $Vg_{62}$ of the voltage transforming TFT 62 undergoes a change.

The above-mentioned circuit is inserted between the drain and the gate of the protective TFT 57 thereby to hold the relation $V(57\text{-}G)-V(57\text{-}D)=V(62\text{-}S)-V(62\text{-}G)=-Vgs_{61}=-d<0$. In other words, Vgd<0 between the drain and the gate of the protective TFT 57.

The means for maintaining a potential between the drain and the gate of the protective TFT 57 is not limited to the above-mentioned two including the control TFT 61 and the voltage transforming TFT 62.

Also, the method of reading signals can be implemented alternatively by an X-ray imaging apparatus of pixel charge transfer type shown in FIG. 9 or by an X-ray imaging apparatus of pixel signal amplification type shown in FIG. 11. Nevertheless, the method of reading signals is not limited to the above-mentioned ones.

The operation of the protective circuit 63b will be explained. First, the gate G and the drain D of the protective TFT 57 are shorted to each other, and the source S thereof is connected to GND. Then, the drain voltage and the drain current assume a current characteristic curve C1 as shown in FIG. 15.

Now, in the case where a pixel signal of 0 to x [V] is utilized and the signals higher than x [V] are not required, the threshold voltage y [V] of the protective circuit 63b is required to be higher than x [V].

Figure 15:
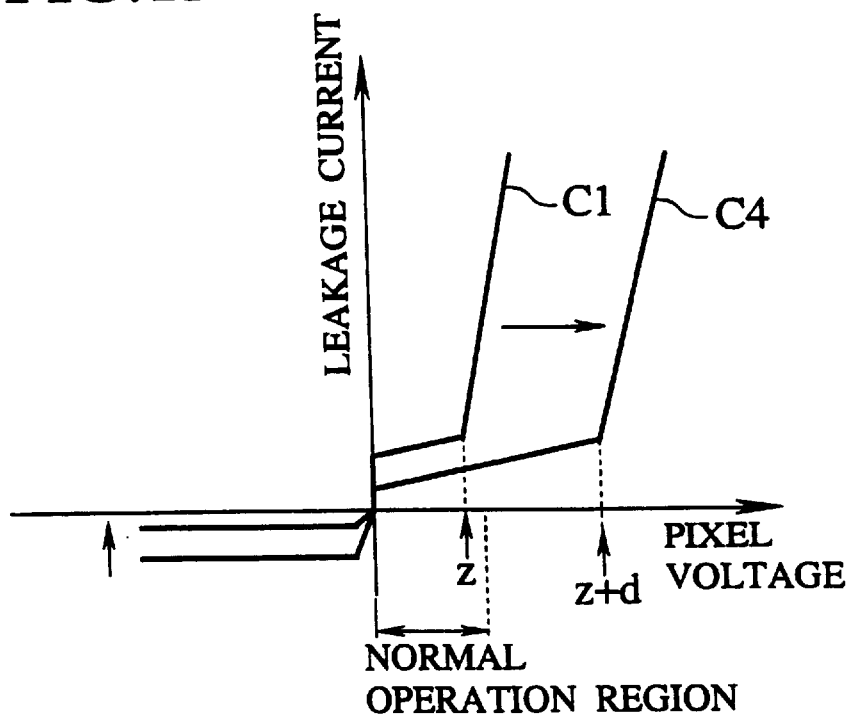
FIG. 15 is a diagram showing the characteristics of the protective TFT according to the eighth embodiment.

Assuming that the gate-source voltage of the control TFT 61 is d [V], the apparent threshold voltage of the protective TFT 57 is given as y=z+d [V] as exhibited by the current characteristic curve C4 of FIG. 15.

If the gate-source voltage of the control TFT 61 is set in such a manner as to hold the relation d=x−z, therefore, the protective circuit 63b can be activated when the voltage applied to the storage capacity section 56 exceeds the normal operating voltage x.

Also, assuming that the drain voltage of the protective TFT 57 is V(57-D) and the source voltage of the protective TFT 57 is V(57-S), the voltage Vgs of the protective TFT 57 is determined as follows.

(1) When V(57-D)>V(57-S), the source in the physical sense of the term is provided by the source terminal 57-S, and the relation holds that $Vgs=V(57\text{-}D)-d-V(57\text{-}S)>-d$ (2) When V(57-D)<V(57-S), on the other hand, the source in the physical sense of the term is provided by the drain terminal 57-D, and the relation holds that $Vgs=-d$ Specifically, even in the case where V(57-D)>V(57-S), the relation is obtained that Vgs<0 so that the leakage current can be reduced sufficiently as long as the relation holds that V(57-D)−V(57-S)<d.

Figure 16:
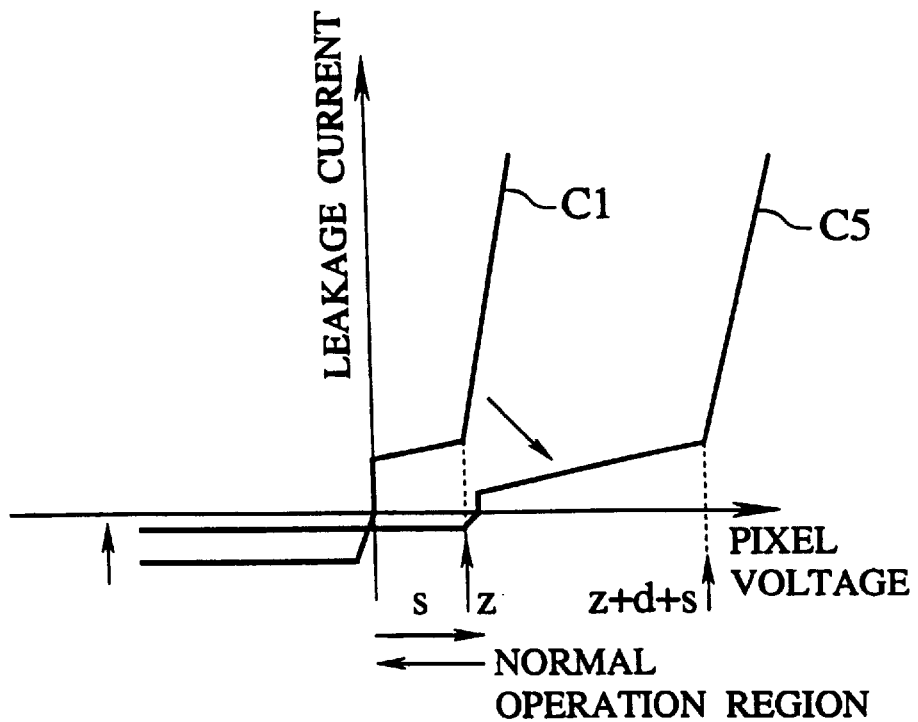
FIG. 16 is a diagram showing the characteristics of the protective TFT according to the eighth embodiment.

Further, by setting the fixed potential of the source S of the protective TFT 57 to s [V], the apparent threshold voltage described below is obtained as shown in FIG. 16.

$y=z+s+d[V]$

Also, at the same time that the apparent threshold voltage is increased, the leakage current in the normal operation range can be reduced from a value associated with Vgs of several volts to a value associated with Vgs=−d [V], as seen from FIG. 16.

In the case where the voltage across the storage capacity section 56 drops abnormally, the drain and the source of the protective TFT 57 are required to be connected in reverse direction.

As described above, according to the eighth embodiment, a circuit with the gate voltage of the protective TFT 57 thereof kept always lower than the drain voltage thereof is inserted between the drain and the gate of the protective TFT 57. In this way, the apparent threshold voltage can be increased arbitrarily, so that the voltage Vgs can utilize the negative region in the normal operation range. Thus the leakage current can be further reduced.

Consequently, the signals required as pixel signals can be read more accurately, and the pixel voltage can be prevented from increasing abnormally beyond the breakdown voltage of the TFT, thus avoiding the breakdown of the TFT.

Now, explanation will be made about an X-ray imaging apparatus according to a ninth embodiment of the invention. A configuration of an X-ray imaging apparatus according to the ninth embodiment is shown in FIG. 17.

Figure 17:
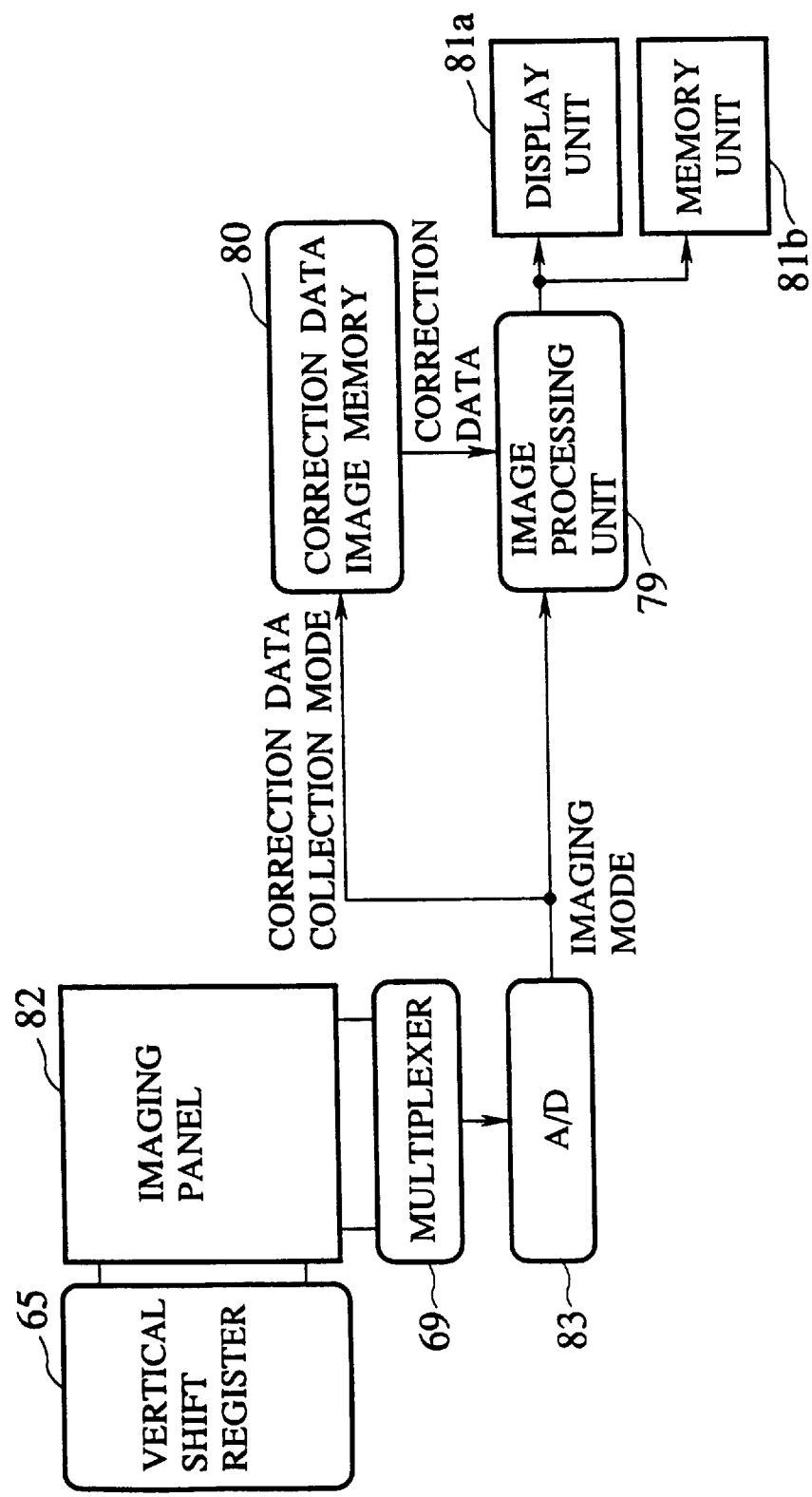
FIG. 17 is a diagram showing a general configuration of an X-ray imaging apparatus according to a ninth embodiment of the present invention.

The X-ray imaging apparatus shown in FIG. 17 comprises a vertical shift register 65, an imaging panel 82, a multiplexer 69, an analog/digital (A/D) converter 83, a correction data image memory 80, an image processing unit 79, a display unit 81a and a memory unit 80b.

The imaging panel 82 includes a flat panel X-ray detector 10b and a plurality of reading amplifiers 68 shown in FIG. 9. The multiplexer 69 converts the parallel outputs from the imaging panel 82 into a serial output, and the analog/digital (A/D) converter 83 converts the signal from the multiplexer 69 into a digital signal.

The correction data image memory 80 collects and stores the correction data on the leakage current output from the A/D converter 83 and flowing in the protective TFTs 57. This correction data is determined based on the signal read out through a charge reading means (such as the transfer TFT 64 shown in FIG. 9) in the absence of an incident light or an incident X ray.

The image processing unit 79 which constitutes a correction means collects from the A/D converter 83 the image data due to the second current obtained by adding the leakage current to the first current due to the charge from the storage capacity section 56 at the time of light or X-ray entrance. The difference image data between the collected image data and the correction data stored in the correction data image memory 80 is determined thereby to produce the image data due to the first current corrected with the leakage current corrected.

The display unit 81a displays the image data with the leakage current corrected from the image processing unit 79. The memory unit 80b stores the image data with the leakage current corrected from the image processing unit 79.

With this configuration, a normal operation range is set in a region where the pixel voltage (the voltage across the storage capacity section 56 shown in FIG. 9) of the protective TFT 57 is lower than the source voltage (the source S shown in FIG. 9). Within this normal operation range, the leakage current maintains a substantially constant level against changes in the pixel value. The leakage current for reading out a single pixel, therefore, is substantially constant regardless of the pixel signal.

The leakage current due to the protection circuit of each pixel can thus be measured by collecting the image in the absence of incident X rays. The correction data obtained by the leakage current is stored in the correction data image memory 80.

Then, the image taken by actual application of X rays is input to the image processing unit 79. The image processing unit 79 determines the difference image data between the input image data and the correction data stored in the correction data image memory 80. As a result, an image data with the leakage current corrected is obtained.

It is thus possible to reduce the leakage current to the limit of the TFT as required in the normal operation range, thereby preventing the deterioration of the pixel signal.

Figure 18:
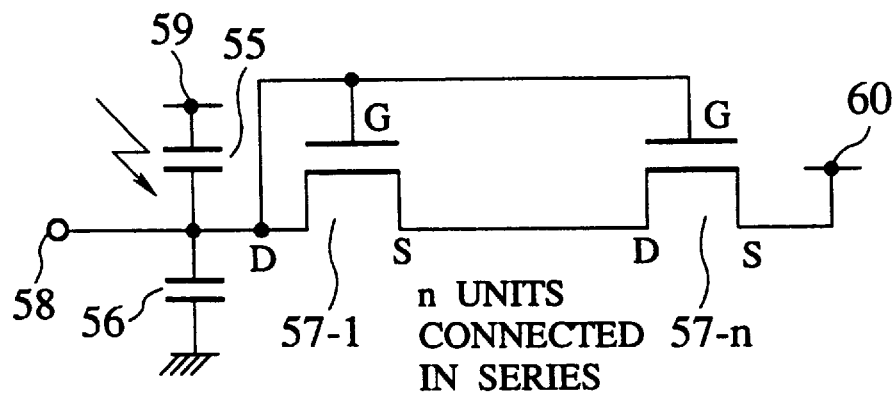
FIG. 18 is a diagram showing a protective circuit according to a tenth embodiment.

Now, explanation will be made about an X-ray imaging apparatus according to a tenth embodiment of the invention. FIG. 18 is a diagram showing a configuration of a protective circuit for an X-ray imaging apparatus according to the tenth embodiment. This X-ray imaging apparatus comprises a plurality of pixels arranged on a flat panel. Each pixel includes a photoelectric conversion section 55 for generating the charge corresponding to the incident light, a storage capacity section 56 for storing the charge thus generated, and a plurality of protective TFTs 57-1 to 57-n for preventing the signal voltage across the storage capacity section 56 from increasing abnormally.

The plurality of protective TFTs 57-1 to 57-n included in each pixel are connected in series. The drain of the protective TFT 57-1 constituting the first TFT is shorted to the gates of all the TFTs 57-1 to 57-n. The drain D making up an end of the protective TFT 57-1 is connected to the voltage-variable terminal of the storage capacity section 56, and the source S constituting the other end of the protective TFT 57-n is set to a fixed potential of s [V].

The photoelectric conversion section 55 is made of, for example, selenium capable of converting X rays directly into the charge. When selenium is used, a voltage of several KV is required to be applied across a selenium film. In the case where a strong X ray is irradiated, the charge storage section is also impressed with a voltage of several KV.

A method of reading signals is also implemented by the X-ray imaging apparatus of pixel charge transfer type according to the fifth embodiment shown in FIG. 9 or by the X-ray imaging apparatus of pixel signal amplification type according to the sixth embodiment shown in FIG. 11. The present invention, however, is not limited to these X-ray imaging apparatuses.

With reference to the X-ray imaging apparatus configured as described above, the operation of the plurality of protective TFTs 57-1 to 57-n making up the essential parts of the tenth embodiment will be explained below.

Figure 19:
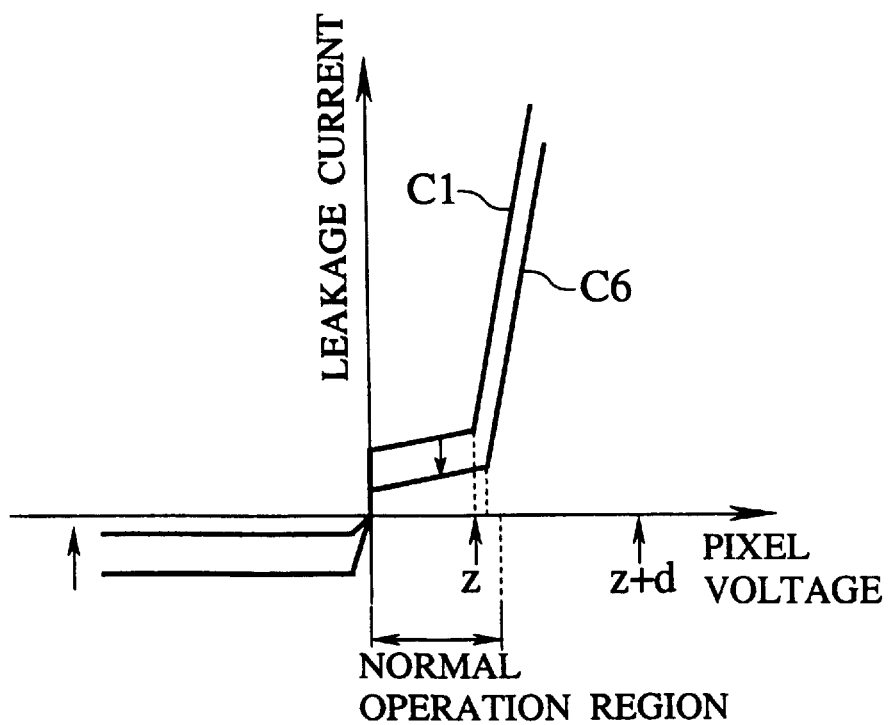
FIG. 19 is a diagram showing the characteristics of the protective TFT according to the tenth embodiment.

First, assume that the gate G and the drain D of a protective TFT 57 are shorted to each other with the source S thereof connected to GND. Then, the drain voltage and the drain current assume a current characteristic curve C1 as shown in FIG. 19.

A voltage at which a current suddenly begins to flow is called the threshold voltage, which is substantially constant regardless of the size of the TFT 57.

Now, a plurality of protective TFTs 57-1 to 57-n are connected in series, and all the gates thereof are connected to the drain of the protective TFT 57-1 as a common terminal. As compared with the case where a single protective TFT 57 is used, the threshold voltage substantially remains unchanged. As indicated by the current characteristic curve C6 of FIG. 19, however, the leakage current in the normal operation range can be reduced.

Figure 20:
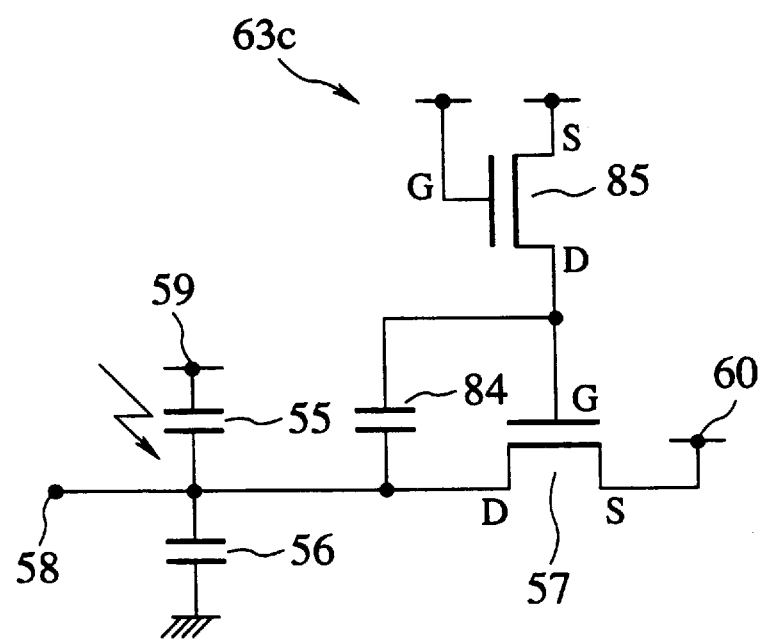
FIG. 20 is a diagram showing a protective circuit according to an 11th embodiment.

Now, an X-ray imaging apparatus according to an 11th embodiment of the invention will be explained. FIG. 20 is a diagram showing a configuration of a protective circuit of an X-ray imaging apparatus according to the 11th embodiment. The protective circuit 63c shown in FIG. 20 includes a protective TFT 57 for preventing the signal voltage across the storage capacity section 56 from increasing abnormally, a voltage transforming capacitor 84 and a transformation charge source TFT 85, all included in each pixel.

The voltage transforming capacitor 84 is inserted between the gate and the drain of the protective TFT 57, and the drain of the transformation voltage source TFT 85 is connected to the gate of the protective TFT 57.

In the absence of the charge in the storage capacity section 56 (before the signal is stored or immediately after the signal is read), the gate of the voltage transformation charge source TFT 85 is turned on thereby to supply the charge to the voltage transforming capacitor 84. In the process, the drain of the protective TFT 57 is zero [V], and therefore the voltage −d [V] applied to the source of the voltage transformation charge source TFT 85 is impressed across the voltage transforming capacitor 84.

At this time, the voltage transformation charge source TFT 85 is turned off and the imaging process is started. In the process, the charge stored in the voltage transforming capacitor 84 remains unchanged, and therefore the voltage across the voltage transforming capacitor 84 also remains unchanged. In other words, the gate-drain potential difference of the protective TFT 57 is kept at −d [V] regardless of the drain voltage of the protective TFT 57. The subsequent process is similar to that of the eighth embodiment and will not be described.

According to the embodiment described above, the protective TFTs sweep out the charge stored in the charge storage section when the voltage applied thereto exceeds a threshold level. As an alternative, the apparent threshold voltage can be increased and the leakage current in the operation region can be further reduced by shifting the characteristic of the pixel voltage versus the leak current appropriately.

The apparent threshold voltage can also be increased and the leakage current can be reduced further by the potential difference derived from a means inserted for that purpose between the gate of the field effect transistor and the charge storage section.

Further, the correction data for the leakage current flowing in the protective TFTs is stored in the memory unit and the image data read from the charge storage section is corrected by the image processing unit based on the correction data, so that the image data with the leakage current corrected is obtained. Consequently, the leakage current in the normal operation region can be reduced to a limit of the field effect transistor as required, thereby preventing the deterioration of the pixel signal.

It should be understood that many modifications and adaptations of the invention will become apparent to those skilled in the art and it is intended to encompass such obvious modifications and changes in the scope of the claims appended hereto.

What is claimed is:

1. An X-ray imaging apparatus comprising:
   a plurality of charge conversion means corresponding to a plurality of pixels arranged on a detection surface, each of said plurality of charge conversion means directly converting incident X rays into a charge;
   a plurality of charge storage means for storing the charge converted by each of said plurality of charge conversion means;
   a plurality of charge reading means for reading the charge stored in each of said plurality of charge storage means; and
   a plurality of sweeping means, each of the plurality of sweeping means having one end thereof connected to a terminal of each of said plurality of charge reading means, each of the plurality of sweeping means sweeping the charge stored in said charge storage means from the one end connected to the terminal through each of the plurality of sweeping means to an opposite end thereof when a voltage applied thereto exceeds a predetermined voltage level.

2. An X-ray imaging apparatus according to claim 1, wherein each of said plurality of sweeping means includes at least a zener diode.

3. An X-ray imaging apparatus according to claim 2, wherein the opposite end of each of said plurality of sweeping means is supplied with a predetermined potential other than earth potential.

4. An X-ray imaging apparatus according to claim 1, wherein each of said plurality of sweeping means includes a plurality of zener diodes connected in series to each other.

5. An X-ray imaging apparatus according to claim 4, wherein the opposite end of each of said plurality of sweeping means is supplied with a predetermined potential other than earth potential.

6. An X-ray imaging apparatus according to claim 1, wherein each of said plurality of sweeping means includes a specific field effect transistor with a gate thereof connected to selected one of a source and a drain thereof.

7. An X-ray imaging apparatus according to claim 6, wherein said gate and selected one of said source and said drain are connected to each other through means for generating a predetermined potential difference.

8. An X-ray imaging apparatus according to claim 7, wherein said potential difference generating means includes:
   a first field effect transistor with a gate thereof connected to the selected one of said source and said drain of said specific field effect transistor, with a source thereof connected to said gate of said specific field effect transistor, and with a drain thereof connected to a predetermined voltage terminal; and
   a second field effect transistor with a drain thereof connected to the source of said first field effect transistor and with a gate and a source thereof connected to a predetermined voltage terminal.

9. An X-ray imaging apparatus according to claim 8, wherein the opposite end of each of said plurality of sweeping means is supplied with a predetermined potential other than earth potential.

10. An X-ray imaging apparatus according to claim 7, wherein said potential difference generating means includes:
    a capacitor interposed between said gate and the selected one of said source and said drain of said specific field effect transistor; and
    another field effect transistor with a drain thereof connected to said gate of said specific field effect transistor and with a gate and a source thereof connected to a predetermined voltage terminal.

11. An X-ray imaging apparatus according to claim 10, wherein the opposite end of each of said plurality of sweeping means is supplied with a predetermined potential other than earth potential.

12. An X-ray imaging apparatus according to claim 7, wherein the opposite end of each of said plurality of sweeping means is supplied with a predetermined potential other than earth potential.

13. An X-ray imaging apparatus according to claim 6, wherein the opposite end of each of said plurality of sweeping means is supplied with a predetermined potential other than earth potential.

14. An X-ray imaging apparatus according to claim 1, wherein each of said plurality of sweeping means includes a plurality of field effect transistors connected in series to each other, each of said field effect transistors having a gate thereof connected to selected one of a source and a drain thereof.

15. An X-ray imaging apparatus according to claim 14, wherein the opposite end of each of said plurality of sweeping means is supplied with a predetermined potential other than earth potential.

16. An X-ray imaging apparatus according to claim 1, wherein each of said plurality of sweeping means includes a plurality of field effect transistors connected in series to each other, each of said field effect transistors having a gate thereof connected in common to said one end.

17. An X-ray imaging apparatus according to claim 16, wherein the opposite end of each of said plurality of sweeping means is supplied with a predetermined potential other than earth potential.

18. An X-ray imaging apparatus according to claim 1, wherein the opposite end of each of said plurality of sweeping means is supplied with a predetermined potential other than earth potential.

19. An X-ray imaging apparatus according to claim 1, wherein said predetermined voltage is a voltage associated with a saturated charge of said pixel.

20. An X-ray imaging apparatus according to claim 19, further comprising charge retrieval means for retrieving each of the charges swept out respectively through each of said plurality of sweeping means.

21. An X-ray imaging apparatus according to claim 20, wherein said charge retrieval means includes a common amplifier for retrieving each of the charges swept out respectively through each of said plurality of sweeping means.

22. An X-ray imaging apparatus according to claim 20, wherein each of said sweeping means is divided into a plurality of blocks, and said charge retrieval means includes a plurality of amplifiers, each of said plurality of amplifiers retrieving a plurality of charges from a corresponding one of said blocks.

23. An X-ray imaging apparatus according to claim 20, further comprising control means for controlling an X-ray generating unit on the basis of the output from said charge retrieval means.

24. An X-ray imaging apparatus according to claim 1, further comprising:

correction data storing means for storing a value of each charge read out from each of said charge reading means as correction data in the absence of X rays incident to said plurality of pixels; and correction means for subtracting a corresponding charge value of the correction data from each of charge values read out by said plurality of charge reading means in the presence of X rays incident to said plurality of pixels and thus determining an accurate value of the charge not affected by the leakage current.

25. An X-ray imaging apparatus according to claim 24, further comprising display means for displaying the accurate charge value determined by said correction means as an image.

26. An X-ray imaging apparatus according to claim 24, further comprising image data memory means for storing the accurate charge value determined by said correction means.

* * * * *